(12) United States Patent
Choung et al.

(10) Patent No.: US 10,396,136 B2
(45) Date of Patent: Aug. 27, 2019

(54) ORGANIC LIGHT-EMITTING DISPLAY DEVICE

(71) Applicant: SAMSUNG DISPLAY CO., LTD., Yongin-si, Gyeonggi-do (KR)

(72) Inventors: Jiyoung Choung, Yongin-si (KR); Jungsun Park, Yongin-si (KR); Minsoo Shin, Yongin-si (KR); Insung Hwang, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 16/136,458

(22) Filed: Sep. 20, 2018

(65) Prior Publication Data

US 2019/0035867 A1 Jan. 31, 2019

Related U.S. Application Data

(63) Continuation of application No. 15/839,307, filed on Dec. 12, 2017, now Pat. No. 10,090,366, which is a (Continued)

(30) Foreign Application Priority Data

Feb. 24, 2015 (KR) .................. 10-2015-0025911

(51) Int. Cl.
*H01L 27/32* (2006.01)
*H01L 51/52* (2006.01)

(52) U.S. Cl.
CPC ...... *H01L 27/3246* (2013.01); *H01L 27/3211* (2013.01); *H01L 51/5225* (2013.01); *H01L 27/3216* (2013.01); *H01L 27/3218* (2013.01)

(58) Field of Classification Search
None
See application file for complete search history.

(56) References Cited

U.S. PATENT DOCUMENTS 7,656,084 B2 2/2010 Ishida
8,299,705 B2 10/2012 Choi
(Continued)

FOREIGN PATENT DOCUMENTS

KR 10-2002-0059535 A 7/2002
KR 10-2003-0017695 A 3/2003
(Continued)

OTHER PUBLICATIONS

Taiwanese Office action dated Jun. 14, 2019.

*Primary Examiner* — Lex H Malsawma
(74) *Attorney, Agent, or Firm* — Lee & Morse, P.C.

(57) ABSTRACT

An organic light-emitting display device, including a substrate that includes a plurality of first emission portions that realize a first color and a plurality of second emission portions that realize a second color; a pixel-defining film that defines the plurality of first emission portions and the plurality of second emission portions; a plurality of pixel electrodes that are separate from each other and respectively correspond to the plurality of first emission portions; and a first stacked structure that includes an intermediate layer and a counter electrode on the intermediate layer, the intermediate layer including an organic emission layer emitting light of the first color, the first stacked structure further including first emission pattern portions respectively corresponding to the plurality of first emission portions, and first connection pattern portions on the pixel-defining film, the first connection pattern portions connecting the first emission pattern portions.

18 Claims, 17 Drawing Sheets

Related U.S. Application Data continuation of application No. 14/838,390, filed on Aug. 28, 2015, now Pat. No. 9,859,344.

(56) References Cited

U.S. PATENT DOCUMENTS

| | | |
|---|---|---|
| 8,809,111 B2 | 8/2014 | Ober et al. |
| 8,846,301 B2 | 9/2014 | Ober et al. |
| 9,064,828 B2 * | 6/2015 | Oh .................. H01L 51/5253 |
| 9,153,791 B2 | 10/2015 | Akamatsu et al. |
| 9,331,127 B2 | 5/2016 | Kim et al. |
| 2003/0038589 A1 | 2/2003 | Kim et al. |
| 2013/0128209 A1 | 5/2013 | Kawamura et al. |
| 2013/0168652 A1 * | 7/2013 | Nam .................. H01L 51/50 |
| | | 257/40 |
| 2013/0236999 A1 | 9/2013 | Lee et al. |
| 2014/0127625 A1 | 5/2014 | Defranco et al. |
| 2014/0175390 A1 | 6/2014 | Kim et al. |
| 2015/0069362 A1 | 3/2015 | Ito |

FOREIGN PATENT DOCUMENTS

| | | |
|---|---|---|
| KR | 10-2007-0037091 A | 4/2007 |
| TW | 200731842 | 8/2007 |

* cited by examiner

ORGANIC LIGHT-EMITTING DISPLAY DEVICE

CROSS-REFERENCE TO RELATED APPLICATIONS

This is a continuation application based on pending application Ser. No. 15/839,307, filed Dec. 12, 2017, which in turn is a continuation of application Ser. No. 14/838,390, filed Aug. 28, 2015, now U.S. Pat. No. 9,859,344, issued Jan. 2, 2018, the entire contents of both of which is hereby incorporated by reference.

Korean Patent Application No. 10-2015-0025911, filed on Feb. 24, 2015, in the Korean Intellectual Property Office, and entitled: "Organic Light-Emitting Display Device and Method of Manufacturing the Same," is incorporated by reference herein in its entirety.

BACKGROUND

1. Field

One or more exemplary embodiments relate to an organic light-emitting display device and a method of manufacturing the same.

2. Description of the Related Art

An organic light-emitting display device is a display device in which pixels may each include an organic light-emitting diode (OLED). The OLED may include a pixel electrode, a counter electrode facing the pixel electrode, and an emission layer disposed between the pixel electrode and the counter electrode. In the organic light-emitting display device, the pixel electrodes may have island shapes patterned according to the pixels, and the counter electrode may be shaped such that the counter electrode integrally covers the pixels.

SUMMARY

One or more exemplary embodiments may include an organic light-emitting display device and a method of manufacturing the same.

Embodiments may be realized by providing an organic light-emitting display device, including a substrate that includes a plurality of first emission portions that realize a first color and a plurality of second emission portions that realize a second color; a pixel-defining film that defines the plurality of first emission portions and the plurality of second emission portions; a plurality of pixel electrodes that are separate from each other and respectively correspond to the plurality of first emission portions; and a first stacked structure that includes an intermediate layer and a counter electrode on the intermediate layer, the intermediate layer including an organic emission layer emitting light of the first color, the first stacked structure further including first emission pattern portions respectively corresponding to the plurality of first emission portions, and first connection pattern portions on the pixel-defining film, the first connection pattern portions connecting the first emission pattern portions.

The first connection pattern portions may be on a portion of a top surface of the pixel-defining film.

The counter electrode of the first stacked structure may include first regions that face the pixel electrodes respectively corresponding to the plurality of first emission portions; and a second region that connects the first regions.

The intermediate layer of the first stacked structure may include third regions that are on the pixel electrodes respectively corresponding to the plurality of first emission portions; and a fourth region that connects the third regions.

The pixel-defining film may include openings corresponding to the plurality of first emission portions, and the third regions may be at locations respectively corresponding to the openings, and the fourth region may be on a portion of a top surface of the pixel-defining film.

The intermediate layer of the first stacked structure and the counter electrode of the first stacked structure may have a substantially same pattern.

The intermediate layer of the first stacked structure may further include a first intermediate layer that is below the organic emission layer in a direction away from the counter electrode, and the organic emission layer may be between the counter electrode and the first intermediate layer.

The first intermediate layer may include a hole transport layer.

The organic light-emitting display device may further include a second stacked structure including an intermediate layer and a counter electrode on the intermediate layer, the intermediate layer of the second stacked structure including an organic emission layer emitting light of the second color. The second stacked structure may further include second emission pattern portions respectively corresponding to the plurality of second emission portions, and second connection pattern portions on the pixel-defining film, the second connection pattern portions connecting the second emission pattern portions.

The second connection pattern portions may be on a portion of a top surface of the pixel-defining film.

At least one of the first connection pattern portions and at least one of the second connection pattern portions may overlap each other on the portion of the top surface of the pixel-defining film.

The counter electrode of the second stacked structure may include fifth regions that face the pixel electrodes respectively corresponding to the plurality of second emission portions; and a sixth region that connects the fifth regions.

The intermediate layer of the second stacked structure may include seventh regions that are on the pixel electrodes respectively corresponding to the plurality of second emission portions; and an eighth region that connects the seventh regions.

The intermediate layer of the second stacked structure and the counter electrode of the second stacked structure may have a substantially same pattern.

The organic light-emitting display device may further include a protection film on the counter electrode of the first stacked structure.

The protection film may have a substantially same pattern as the intermediate layer and the counter electrode of the first stacked structure.

The counter electrode of the first stacked structure may include a semi-transmissive metal layer, and the protection film may be transparent.

Embodiments may be realized by providing a method of manufacturing an organic light-emitting display device, the method including preparing a substrate that includes a plurality of first emission portions that realize a first color and a plurality of second emission portions that realize a second color; forming a plurality of pixel electrodes having an island shape so as to separate from each other and respectively correspond to the plurality of first emission portions of the substrate; forming, on the substrate, a pixel-defining film that includes openings corresponding to the plurality of first emission portions and the plurality of second emission portions; and forming a first stacked structure that includes an intermediate layer and a counter electrode on the intermediate layer, the intermediate layer including an organic emission layer emitting light of the first color, the first stacked structure further including first emission pattern portions respectively corresponding to the plurality of first emission portions, and first connection pattern portions on the pixel-defining film, the first connection pattern portions connecting the first emission pattern portions.

The first connection pattern portions of the first stacked structure may be on a portion of a top surface of the pixel-defining film.

The intermediate layer of the first stacked structure and the counter electrode of the first stacked structure may have a substantially same pattern.

Forming the first stacked structure may include forming, on the substrate, a masking pattern that includes an opening exposing the plurality of first emission portions, and a first non-emission portion connecting the plurality of first emission portions, the first non-emission portion corresponding to a portion of a top surface of the pixel-defining film; forming the intermediate layer including the organic emission layer emitting the light of the first color, on an entire surface of the substrate on which the masking pattern is formed; forming the counter electrode on the intermediate layer; and removing the masking pattern such that the first emission pattern portions respectively corresponding to the plurality of first emission portions remain, and the first connection pattern portions that correspond to the first non-emission portion and connect the first emission pattern portions remain.

The intermediate layer of the first stacked structure may further include a first intermediate layer that is below the organic emission layer in a direction away from the counter electrode, and the organic emission layer may be between the counter electrode and the first intermediate layer.

The first intermediate layer may include a hole transport layer.

The method may further include forming a second stacked structure that includes an intermediate layer and a counter electrode on the intermediate layer, the intermediate layer including an organic emission layer emitting light of the second color. The second stacked structure may further include second emission pattern portions respectively corresponding to the plurality of second emission portions, and second connection pattern portions on the pixel-defining film, the second connection pattern portions connecting the second emission pattern portions.

At least one of the second connection pattern portions and at least one of the first connection pattern portions may overlap each other on a portion of a top surface of the pixel-defining film.

The intermediate layer of the second stacked structure and the counter electrode of the second stacked structure may have a substantially same pattern.

The method may further include forming a protection film on the counter electrode of the first stacked structure.

The protection film may have a substantially same pattern as the intermediate layer and the counter electrode of the first stacked structure.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
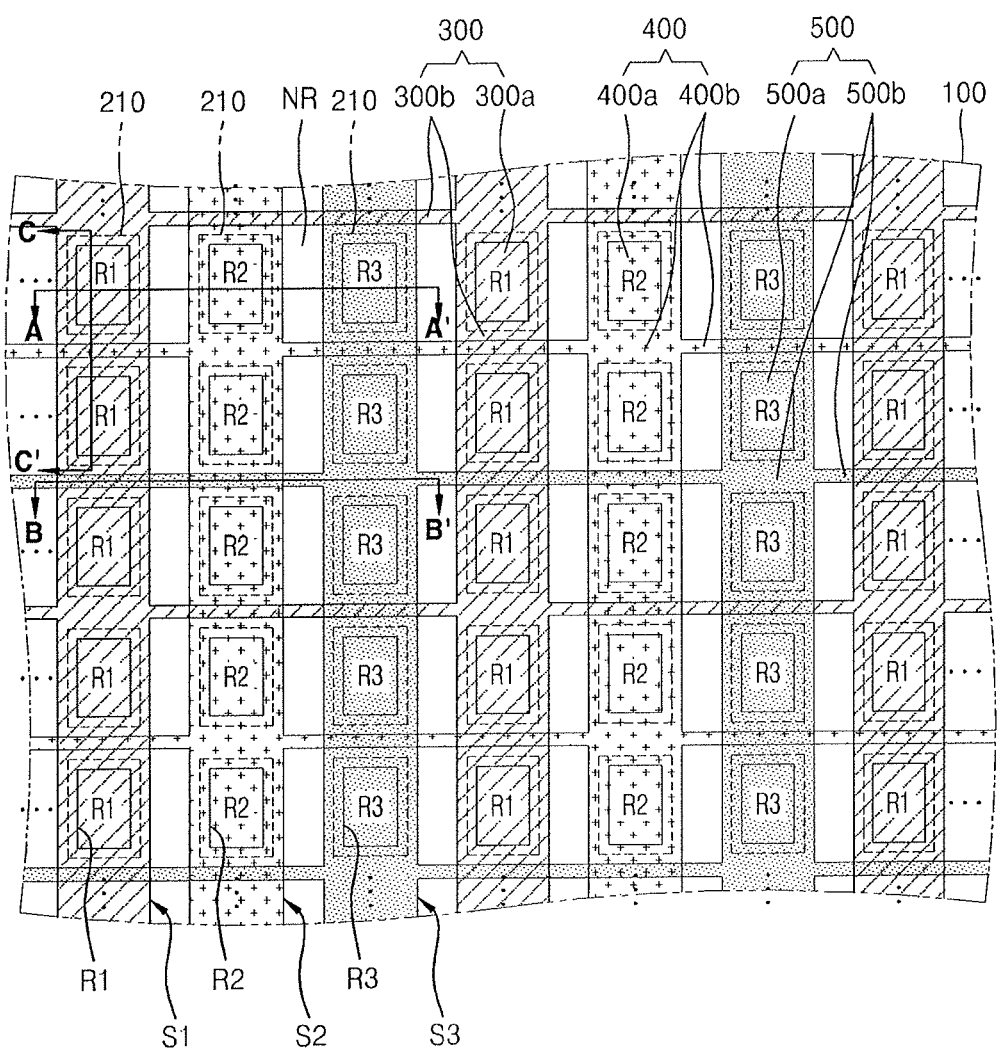
FIG. 1 illustrates a schematic top view of an organic light-emitting display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In drawings, like reference numerals refer to like elements throughout and overlapping descriptions shall not be repeated.

As used herein, the term "and/or" includes any and all combinations of one or more of the associated listed items.

It will be understood that although the terms "first", "second", etc., may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a component or layer is referred to as being "on" another component or layer, the component or layer can be directly on another component or layer or intervening component or layers. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

FIG. 1 illustrates a schematic top view of an organic light-emitting display device according to an exemplary embodiment.

Referring to FIG. 1, the organic light-emitting display device may include a plurality of emission portions (active areas), i.e., first through third emission portions R1 through R3. The first through third emission portions R1 through R3 may be disposed to form a matrix. The first through third emission portions R1 through R3 may each emit different lights and may each correspond to a pixel. For example, each of the first through third emission portions R1 through R3 may be a pixel realizing, e.g., displaying, red, green, or blue. Hereinafter, for convenience of description, the first emission portion R1 realizes red, the second emission portion R2 realizes green, and the third emission portion R3 realizes blue, but an exemplary embodiment is not limited thereto. Colors realized by the first through third emission portions R1 through R3 are not limited to red, green, and blue as long as full color is realized. According to an exemplary embodiment, any combination of colors may be used, such as a combination of four colors, i.e., red, green, blue, and white, as long as full color is realized.

Pixel electrodes 210 and first through third stacked structures 300 through 500 may be disposed on a substrate 100. The pixel electrodes 210 may be patterned in island types to be separated from each other correspondingly to the first through third emission portions R1 through R3. The first through third stacked structures 300 through 500 may be patterned to have patterns connected to each other, like a net. The first stacked structure 300 may include first emission pattern portions 300a corresponding to the first emission portions R1, and first connection pattern portions 300b connecting the first emission pattern portions 300a, wherein the first emission pattern portions 300a and the first connection pattern portions 300b may form a first pattern S1 like a net. The second stacked structure 400 may include second emission pattern portions 400a corresponding to the second emission portions R2, and second connection pattern portions 400b connecting the second emission pattern portions 400a, wherein the second emission pattern portions 400a and the second connection pattern portions 400b may form a second pattern S2 like a net. The third stacked structure 500 may include third emission pattern portions 500a corresponding to the third emission portions R3, and third connection pattern portions 500b connecting the third emission pattern portions 500a, wherein the third emission pattern portions 500a and the third connection pattern portions 500b may form a third pattern S3 like a net.

The first through third stacked structures 300 through 500 may include intermediate layers 320 through 520 (refer to FIG. 2) and counter electrodes 330 through 530 (refer to FIG. 2), respectively. The intermediate layers 320 through 520 and the counter electrodes 330 through 530 may be patterned to have substantially the same patterns.

According to a comparative example, when a counter electrode is formed on an entire surface of the substrate 100 to integrally cover a plurality of pixels, i.e., the first through third emission portions R1 through R3, a voltage drop (IR drop) may occur, for example, due to resistance of the counter electrode, and luminance deviation may occur. However, according to one or more exemplary embodiments, the counter electrodes 330 through 530 may be patterned together with the intermediate layers 320 through 520, an increase in the resistance of the counter electrodes 330 through 530 may be prevented, and IR drop and consequent luminance deviation may be reduced or prevented.

Figure 2:
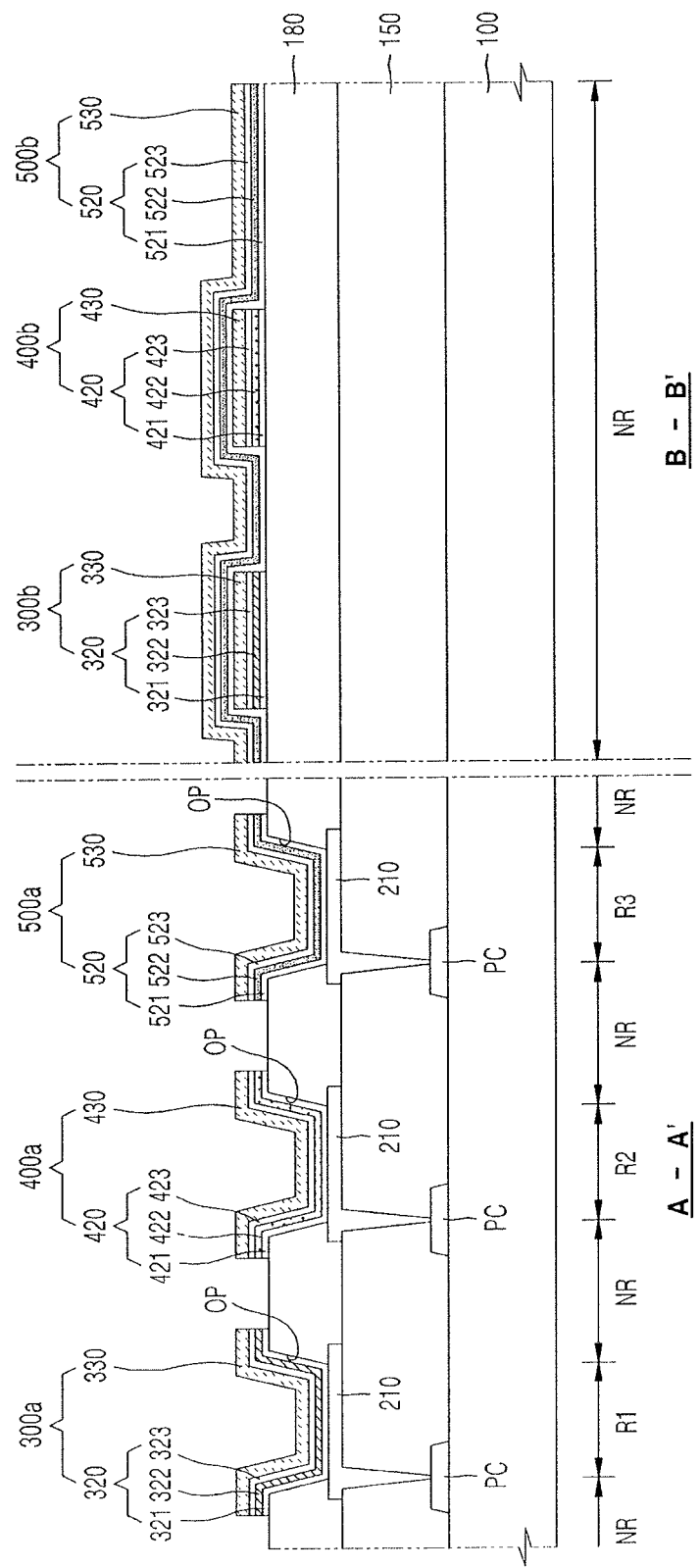
FIG. 2 illustrates a cross-sectional view taken along a line A-A' and a line B-B' of FIG. 1.
Figure 3:
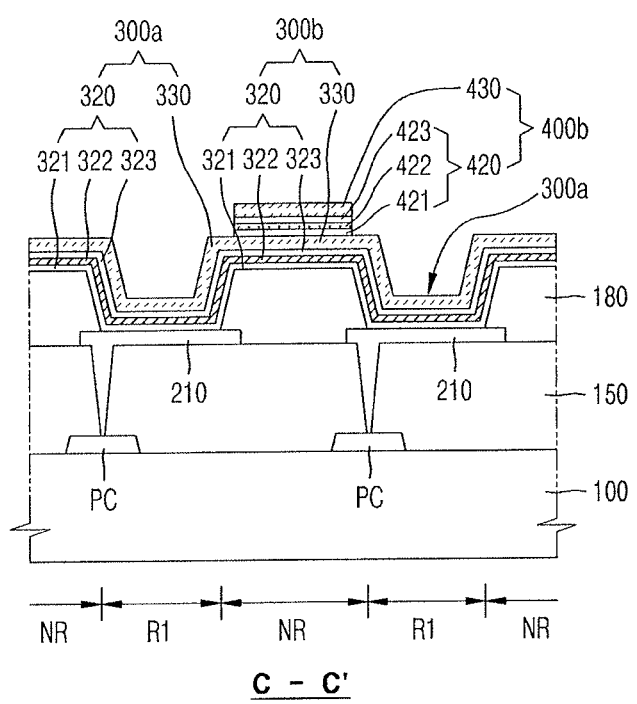
FIG. 3 illustrates a cross-sectional view taken along a line C-C' of FIG. 1.

FIG. 2 illustrates a cross-sectional view taken along a line A-A' and a line B-B' of FIG. 1, and FIG. 3 illustrates a cross-sectional view taken along a line C-C' of FIG. 1.

The substrate 100 may be formed of one of various materials, such as a glass material, a metal material, and a plastic material such as polyethylene terephthalate (PET), polyethylene naphthalate (PEN), or polyimide. According to some embodiments, the substrate 100 may have higher flexibility when the substrate 100 is formed of a plastic material or a metal material than when the substrate 100 is formed of a glass material. A buffer layer formed of $SiO_2$ and/or $SiNx$ may be disposed on the substrate 100 to prevent impurities from penetrating into the substrate 100.

The substrate 100 may include a plurality of emission portions (active areas) R1 through R3, and a non-emission portion (non-active area) NR surrounding the emission portions R1 through R3.

A pixel circuit PC may include a thin-film transistor (TFT) and a capacitor, and may be electrically connected to the pixel electrode 210. A top surface of the pixel circuit PC may be covered by an insulating film 150 that is approximately flat.

The pixel electrode 210 may be formed in each of the first through third emission portions R1 through R3. The pixel electrode 210 may be disposed on the insulating film 150 and may be patterned in an island type correspondingly to each of the first through third emission portions R1 through R3. The pixel electrode 210 may be electrically connected to the TFT of the pixel circuit PC.

The pixel electrode 210 may be a (semi-)transparent electrode having translucency, or a reflective electrode. When the pixel electrode 210 is a (semi-)transparent electrode, the pixel electrode 210 may be formed of, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 210 is a reflective electrode, a reflective film may be formed of silver (Ag), magnesium (Mg), aluminum (Al), platinum (Pt), palladium (Pd), gold (Au), nickel (Ni), neodymium (Nd), iridium (Ir), chromium (Cr), or a compound thereof. According to an exemplary embodiment, the pixel electrode 210 may include a reflective film including Ag, Mg, Al, Pt, Pd, Au, Ni, Nd, Ir, Cr, or a compound thereof, and a film formed of ITO, IZO, ZnO, or $In_2O_3$ on the reflective film.

A pixel-defining film 180 may include openings OP respectively corresponding to the first through third emission portions R1 through R3. The openings OP of the pixel-defining film 180 respectively may correspond to the first through third emission portions R1 through R3 from which lights may be emitted, and a region where the pixel-defining film 180 is disposed may correspond to a non-emission portion (non-active area) NR. At least a portion of a top surface of the pixel electrode 210 may not be covered by the pixel-defining film 180. For example, the opening OP may be formed in the pixel-defining film 180, and a portion of the top surface of the pixel electrode 210 may not be covered by the pixel-defining film 180. An edge of the pixel electrode 210 may be covered by the pixel-defining film 180. The pixel-defining film 180 may include an organic insulating film formed of, for example, acryl resin. The pixel-defining film 180 may increase a distance between an end of the pixel electrode 210 and the counter electrodes 330 through 530, and an electric arc may be prevented from being generated at the end of the pixel electrode 210.

The first through third stacked structures 300 through 500 may be independently, for example, separately, patterned. The first through third stacked structures 300 through 500 may have structures in which the intermediate layers 320 through 520 and the counter electrodes 330 through 530 are sequentially stacked, and have the first through third patterns S1 through S3, respectively.

The first stacked structure 300 may have the first pattern S1 including the first emission pattern portions 300a and the first connection pattern portions 300b. Each of the first emission pattern portions 300a may be disposed on the first emission portion R1, and the first connection pattern portions 300b may be disposed on the non-emission portion NR to connect the first emission pattern portions 300a.

The first stacked structure 300 may include the intermediate layer 320 and the counter electrode 330 stacked on the intermediate layer 320, and the intermediate layer 320 may include a first intermediate layer 321, an organic emission layer 322 emitting a red light, and a second intermediate layer 323, which are sequentially stacked on each other.

The first intermediate layer 321 may have a single layer or multi-layer structure. For example, when the first intermediate layer 321 is formed of a high molecular weight material, the first intermediate layer 321 may be a hole transport layer (HTL) having a single layer structure and may be formed of poly-(3,4)-ethylene-dihydroxy thiophene (PEDOT) or polyaniline (PANT). When the first intermediate layer 321 is formed of low molecular weight material, the first intermediate layer 321 may include a hole injection layer (HIL) and a HTL.

The organic emission layer 322 may be disposed on the first intermediate layer 321. According to an exemplary embodiment, the organic emission layer 322 may include, as a host material, an anthracene derivative or a carbazole-based compound, and may include, as a dopant material, a phosphor including at least one of PIQIr(acac)(bis(1-phenylisoquinoline)acetylacetonate iridium), PQIr(acac(bis(1-phenylquinoline)acetylacetonate iridium), PQIr(tris(1-phenylquinoline) iridium), and PtPEP(octaethylporphyrin platinum). According to an exemplary embodiment, the organic emission layer 322 may include a fluorescent material, such as, for example, PED:Eu(DBM)3(Phen) or perylene.

The second intermediate layer 323 may be disposed on the organic emission layer 322. The second intermediate layer 323 may be omitted in some embodiments. For example, when the first intermediate layer 321 and the organic emission layer 322 are formed of a high molecular weight material, the second intermediate layer 323 may be omitted. When the first intermediate layer 321 and the organic emission layer 322 are formed of a low molecular weight material, the second intermediate layer 323 may be formed such that light-emitting characteristic is increased. The second intermediate layer 323 may have a single layer or a multi-layer structure, and may include an electron transport layer (ETL) and/or an electron injection layer (EIL).

The counter electrode 330 may be a (semi-)transparent electrode having translucency or a reflective electrode. According to an exemplary embodiment, when the counter electrode 330 is a (semi-)transparent electrode, the counter electrode 330 may include a semi-transmissive metal layer including Ag and Mg. For example, the counter electrode 330 may be formed of an Ag—Mg alloy in which an amount of Ag is higher than an amount of Mg. According to an exemplary embodiment, the counter electrode 330 may include a layer formed of lithium (Li), calcium (Ca), lithium fluoride (LiF)/Ca, LiF/Al, Al, Mg, or a compound thereof, and another layer disposed on the layer and formed of a (semi-)transparent material, such as ITO, IZO, ZnO, or $In_2O_3$.

When the counter electrode 330 is a reflective electrode, the reflective electrode may be formed by forming a layer including, for example, at least one of Li, Ca, LiF/Ca, LiF/Al, Al, Ag, and Mg. In an embodiment, a structure and material of the counter electrode 330 may vary; for example, the counter electrode 330 may be formed of another material and may have a multi-layer structure.

The counter electrode 330 may be patterned to be disposed on the first emission portions R1 and a part of the non-emission portion NR (for example, a portion of the top surface of the pixel-defining film 180), resistance may be reduced, and IR drop caused by the resistance of the counter electrode 330 and consequent luminance deviation may be reduced or prevented.

The first stacked structure 300 may include the intermediate layer 320 and the counter electrode 330 disposed on the intermediate layer 320, and the intermediate layer 320 and the counter electrode 330 may have substantially the same pattern. For example, the intermediate layer 320 and the counter electrode 330 may have the first pattern S1. For example, the counter electrode 330 may include regions (hereinafter, referred to as first regions) corresponding to the first emission pattern portions 300a and disposed in the first emission portion R1, and a region (hereinafter, referred to as a second region) corresponding to the first connection pattern portion 300b and disposed on a portion of the top surface of the pixel-defining film 180 to connect the first regions. The intermediate layer 320 may include regions (hereinafter, referred to as third regions) corresponding to the first emission pattern portions 300a and disposed in the first emission portion R1, and a region (hereinafter, referred to as a fourth region) corresponding to the first connection pattern portion 300b and disposed on a portion of the top surface of the pixel-defining film 180 to connect the third regions. The first region of the counter electrode 330 and the third region of the intermediate layer 320 may overlap each other, and the second region of the counter electrode 330 and the fourth region of the intermediate layer 320 may overlap each other.

Since the intermediate layer 320 of the first emission pattern portion 300a, i.e., the third region of the intermediate layer 320, is disposed between the pixel electrode 210 and the counter electrode 330, when an electric signal is applied to each of the pixel electrode 210 and the counter electrode 330, excitons generated as holes and electrons discharged from the pixel electrode 210 and the counter electrode 330 that may combine at the organic emission layer 322 may change from an excited state to a ground state to generate a red light. Since the intermediate layer 320 of the first connection pattern portion 300b, i.e., the fourth region of the intermediate layer 320, is disposed on the pixel-defining film 180 where the pixel electrode 210 is not disposed, light may not be emitted even when an electric signal is applied to the counter electrode 330 of the first stacked structure 300.

The second stacked structure 400 may have the second pattern S2 including the second emission pattern portions 400a and the second connection pattern portions 400b. Each of the second emission pattern portions 400a may be disposed on the second emission portion R2, and the second connection pattern portions 400b may be disposed on the non-emission portion NR to connect the second emission pattern portions 400a.

The second stacked structure 400 may include the intermediate layer 420 and the counter electrode 430 stacked on the intermediate layer 420, and the intermediate layer 420 may include a first intermediate layer 421, an organic emission layer 422 emitting a green light, and a second intermediate layer 423, which are sequentially stacked on each other.

The first intermediate layer 421 may have a single layer or a multi-layer structure. For example, when the first intermediate layer 421 is formed of a high molecular weight material, the first intermediate layer 421 may be an HTL having a single layer structure and formed of PEDOT or PANI. When the first intermediate layer 421 is formed of a low molecular weight material, the first intermediate layer 421 may include an HIL and an HTL.

The organic emission layer 422 may be disposed on the first intermediate layer 421. According to an exemplary embodiment, the organic emission layer 422 may include, as a host material, an anthracene derivative or a carbazole-based compound, and may include, as a dopant material, a phosphor including fac tris(2-phenylpyridine) iridium (Ir(ppy)3). According to an exemplary embodiment, the organic emission layer 422 may include a fluorescent material such as, for example, tris(8-hydroxyquinoline) aluminum (Alq3).

The second intermediate layer 423 may be disposed on the organic emission layer 422. The second intermediate layer 423 may be omitted in some embodiments. For example, when the first intermediate layer 421 and the organic emission layer 422 are formed of a high molecular weight material, the second intermediate layer 423 may be omitted. When the first intermediate layer 421 and the organic emission layer 422 are formed of a low molecular material, the second intermediate layer 423 may be formed such that light-emitting characteristic is increased. The second intermediate layer 423 may have a single layer or a multi-layer structure, and may include an ETL and/or an EIL.

The counter electrode 430 may be a (semi-)transparent electrode having translucency or a reflective electrode. According to an exemplary embodiment, when the counter electrode 430 is a (semi-)transparent electrode, the counter electrode 430 may include a semi-transmissive metal layer including Ag and Mg. For example, the counter electrode 430 may be formed of an Ag—Mg alloy in which an amount of Ag is higher than an amount of Mg. According to an exemplary embodiment, the counter electrode 430 may include a layer formed of Li, Ca, LiF/Ca, LiF/Al, Al, Mg, or a compound thereof, and another layer disposed on the layer and formed of a (semi-) transparent material, such as ITO, IZO, ZnO, or $In_2O_3$.

When the counter electrode 430 is a reflective electrode, the reflective electrode may be formed by forming a layer including, for example, at least one of Li, Ca, LiF/Ca, LiF/Al, Al, Ag, and Mg. In an embodiment, a structure and material of the counter electrode 430 may vary; for example, the counter electrode 430 may be formed of another material and may have a multi-layer structure.

The counter electrode 430 may be patterned to be disposed on the second emission portions R2 and a part of the non-emission portion NR (for example, a portion of the top surface of the pixel-defining film 180), resistance may be reduced, and IR drop caused by the resistance of the counter electrode 430 and consequent luminance deviation may be reduced or prevented.

The second stacked structure 400 may include the intermediate layer 420 and the counter electrode 430 disposed on the intermediate layer 420, and the intermediate layer 420 and the counter electrode 430 may have substantially the same pattern. For example, the intermediate layer 420 and the counter electrode 430 may have the second pattern S2. For example, the counter electrode 430 may include regions (hereinafter, referred to as fifth regions) corresponding to the second emission pattern portions 400a and disposed in the second emission portion R2, and a region (hereinafter, referred to as a sixth region) corresponding to the second connection pattern portion 400b and disposed on a portion of the top surface of the pixel-defining film 180 to connect the fifth regions. The intermediate layer 420 may include regions (hereinafter, referred to as seventh regions) corresponding to the second emission pattern portions 400a and disposed in the second emission portion R2, and a region (hereinafter, referred to as an eighth region) corresponding to the second connection pattern portion 400b and disposed on a portion of the top surface of the pixel-defining film 180 to connect the seventh regions. The fifth region of the counter electrode 430 and the seventh region of the intermediate layer 420 may overlap each other, and the sixth region of the counter electrode 430 and the eighth region of the intermediate layer 420 may overlap each other.

Since the intermediate layer 420 of the second emission pattern portion 400a, i.e., the seventh region of the intermediate layer 420, is disposed between the pixel electrode 210 and the counter electrode 430, when an electric signal is applied to each of the pixel electrode 210 and the counter electrode 430, excitons generated as holes and electrons discharged from the pixel electrode 210 and the counter electrode 430 that may combine at the organic emission layer 422 may change from an excited state to a ground state to generate a green light. Since the intermediate layer 420 of the second connection pattern portion 400b, i.e., the eighth region of the intermediate layer 420, is disposed on the pixel-defining film 180 where the pixel electrode 210 is not disposed, light may not be emitted even when an electric signal is applied to the counter electrode 430 of the second stacked structure 400.

The third stacked structure 500 may have the third pattern S3 including the third emission pattern portions 500a and the third connection pattern portions 500b. Each of the third emission pattern portions 500a may be disposed on the third emission portion R3, and the third connection pattern portions 500b may be disposed on the non-emission portion NR to connect the third emission pattern portions 500a.

The third stacked structure 500 may include the intermediate layer 520 and the counter electrode 530 stacked on the intermediate layer 520, and the intermediate layer 520 may include a first intermediate layer 521, an organic emission layer 522 emitting a blue light, and a second intermediate layer 523, which are sequentially stacked on each other.

The first intermediate layer 521 may have a single layer or a multi-layer structure. For example, when the first intermediate layer 521 is formed of a high molecular weight material, the first intermediate layer 521 may be an HTL having a single layer structure and formed of PEDOT or PANI. When the first intermediate layer 521 is formed of a low molecular weight material, the first intermediate layer 521 may include an HIL and an HTL.

The organic emission layer 522 may be disposed on the first intermediate layer 521. According to an exemplary embodiment, the organic emission layer 522 may include, as a host material, an anthracene derivative or a carbazole-based compound, and may include, as a dopant material, a phosphor including $F_2Irpic$, $(F_2ppy)_2Ir(tmd)$, or $Ir(dfppz)_3$. According to an exemplary embodiment, the organic emission layer 522 may include a fluorescent material including one of, for example, DPVBi, spiro-DPVBi, spiro-6P, distyrylbenzene (DSB), distyrylarylene (DSA), PFO-based polymer, and PPV-based polymer.

The second intermediate layer 523 may be disposed on the organic emission layer 522. The second intermediate layer 523 may be omitted in some embodiments. For example, when the first intermediate layer 521 and the organic emission layer 522 are formed of a high molecular weight material, the second intermediate layer 523 may be omitted. When the first intermediate layer 521 and the organic emission layer 522 are formed of a low molecular material, the second intermediate layer 523 may be formed such that light-emitting characteristic is increased. The second intermediate layer 523 may have a single layer or a multi-layer structure, and may include an ETL and/or an EIL.

The counter electrode 530 may be a (semi-)transparent electrode having translucency or a reflective electrode. According to an exemplary embodiment, when the counter electrode 530 is a (semi-)transparent electrode, the counter electrode 530 may include a semi-transmissive metal layer including Ag and Mg. For example, the counter electrode 430 may be formed of an Ag—Mg alloy in which an amount of Ag is higher than an amount of Mg. According to an exemplary embodiment, the counter electrode 530 may include a layer formed of Li, Ca, LiF/Ca, LiF/Al, Al, Mg, or a compound thereof, and another layer disposed on the layer and formed of a (semi-) transparent material, such as ITO, IZO, ZnO, or $In_2O_3$.

When the counter electrode 530 is a reflective electrode, the reflective electrode may be formed by forming a layer including, for example, at least one of Li, Ca, LiF/Ca, LiF/Al, Al, Ag, and Mg. In an embodiment, a structure and material of the counter electrode 530 may vary; for example, the counter electrode 530 may be formed of another material and may have a multi-layer structure.

The counter electrode 530 may be patterned to be disposed on the third emission portions R3 and a part of the non-emission portion NR (for example, a portion of the top surface of the pixel-defining film 180), resistance may be reduced, and IR drop caused by the resistance of the counter electrode 530 and consequent luminance deviation may be reduced or prevented.

The third stacked structure 500 may include the intermediate layer 520 and the counter electrode 530 disposed on the intermediate layer 520, and the intermediate layer 520 and the counter electrode 530 may have substantially the same pattern. For example, the intermediate layer 520 and the counter electrode 530 may have the third pattern S3. For example, the counter electrode 530 may include regions (hereinafter, referred to as ninth regions) corresponding to the third emission pattern portions 500*a* and disposed in the third emission portion R3, and a region (hereinafter, referred to as a tenth region) corresponding to the third connection pattern portion 500*b* and disposed on a portion of the top surface of the pixel-defining film 180 to connect the ninth regions. The intermediate layer 520 may include regions (hereinafter, referred to as eleventh regions) corresponding to the third emission pattern portions 500*a* and disposed in the third emission portion R3, and a region (hereinafter, referred to as a twelfth region) corresponding to the third connection pattern portion 500*b* and disposed on a portion of the top surface of the pixel-defining film 180 to connect the eleventh regions. The ninth region of the counter electrode 530 and the eleventh region of the intermediate layer 520 may overlap each other, and the tenth region of the counter electrode 530 and the twelfth region of the intermediate layer 520 may overlap each other.

Since the intermediate layer 520 of the third emission pattern portion 500*a*, i.e., the eleventh region of the intermediate layer 520, is disposed between the pixel electrode 210 and the counter electrode 530, when an electric signal is applied to each of the pixel electrode 210 and the counter electrode 530, excitons generated as holes and electrons discharged from the pixel electrode 210 and the counter electrode 530 that may combine at the organic emission layer 522 may change from an excited state to a ground state to generate a blue light. Since the intermediate layer 520 of the third connection pattern portion 500*b*, i.e., the twelfth region of the intermediate layer 520, is disposed on the pixel-defining film 180 where the pixel electrode 210 is not disposed, light may not be emitted even when an electric signal is applied to the counter electrode 530 of the third stacked structure 500.

Since the first through third stacked structures 300 through 500 may be independently and separately patterned, at least two connection pattern portions may overlap on the non-emission portion NR, i.e., on a portion of the top surface of the pixel-defining film 180. As shown in FIG. 1, the line B-B' of FIG. 2, and FIG. 3, the first connection pattern portion 300*b* of the first stacked structure 300 and the third connection pattern portion 500*b* of the third stacked structure 500 may overlap on the pixel-defining film 180, the second connection pattern portion 400*b* of the second stacked structure and the third connection pattern portion 500*b* of the third stacked structure 500 may overlap on the pixel-defining film 180, or the first connection pattern portion 300*b* of the first stacked structure 300 and the second connection pattern portion 400*b* of the second stacked structure 400 may overlap on the pixel-defining film 180.

In the current embodiment, two connection pattern portions overlap on the non-emission portion NR, i.e., on the pixel-defining film 180. In an exemplary embodiment, three connection pattern portions may overlap on the non-emission portion NR, i.e., on the pixel-defining film 180.

The counter electrodes 330 through 530 of the first through third stacked structures 300 through 500 may receive an electric signal by contacting an external electrode power supply line. According to an exemplary embodiment, electric signals may be individually transmitted to the counter electrodes 330 through 530 of the first through third stacked structures 300 through 500. According to an exemplary embodiment, electric signals may be simultaneously transmitted to the counter electrodes 330 through 530 of the first through third stacked structures 300 through 500.

Figure 4:
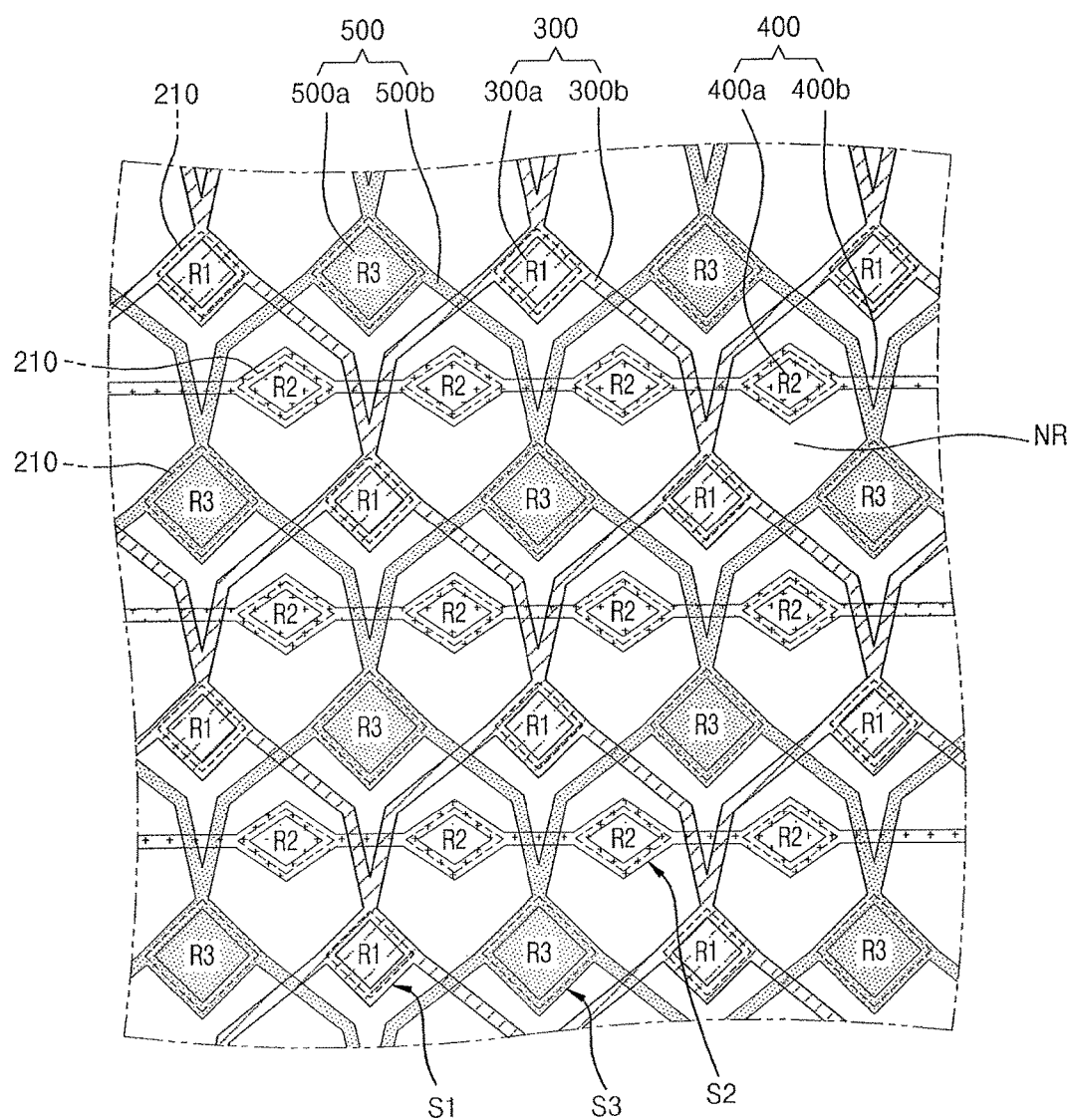
FIG. 4 illustrates a schematic top view of an organic light-emitting display device according to an exemplary embodiment.

FIG. 4 illustrates a schematic top view of an organic light-emitting display device according to an exemplary embodiment.

In an exemplary embodiment, the organic light-emitting display device described above with reference to FIGS. 1 through 3 may include the first through third emission portions R1 through R3 that emit different lights and may be arranged in a matrix form.

Referring to FIG. 4, at least one of the first through third emission portions R1 through R3 may be arranged in a diamond form, or in one of various forms, such as a pentile form.

FIGS. 5 through 15 illustrate views for describing a method of manufacturing an organic light-emitting display device, according to an exemplary embodiment.

Figure 5:
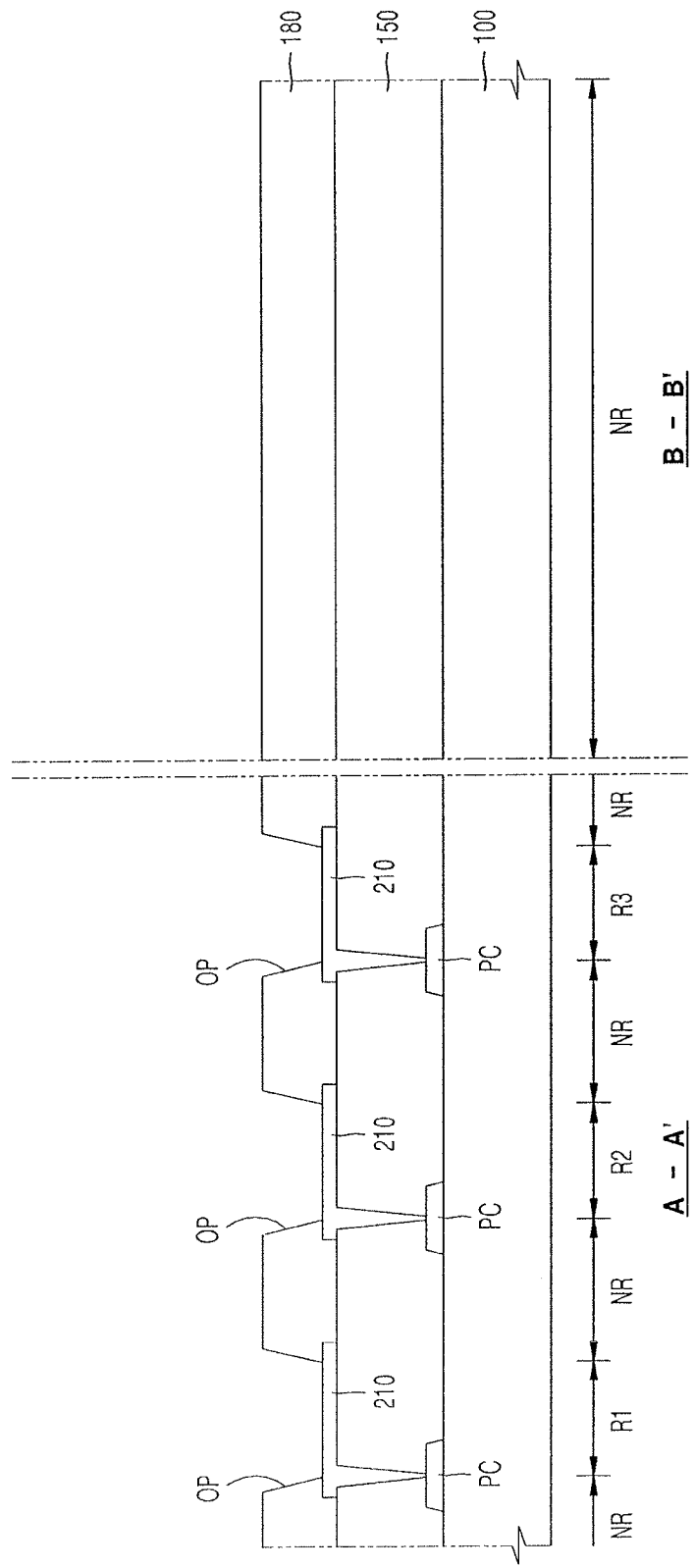
FIG. 5 illustrates a schematic side view of a substrate on which a plurality of emission portions are disposed.
Figure 6:
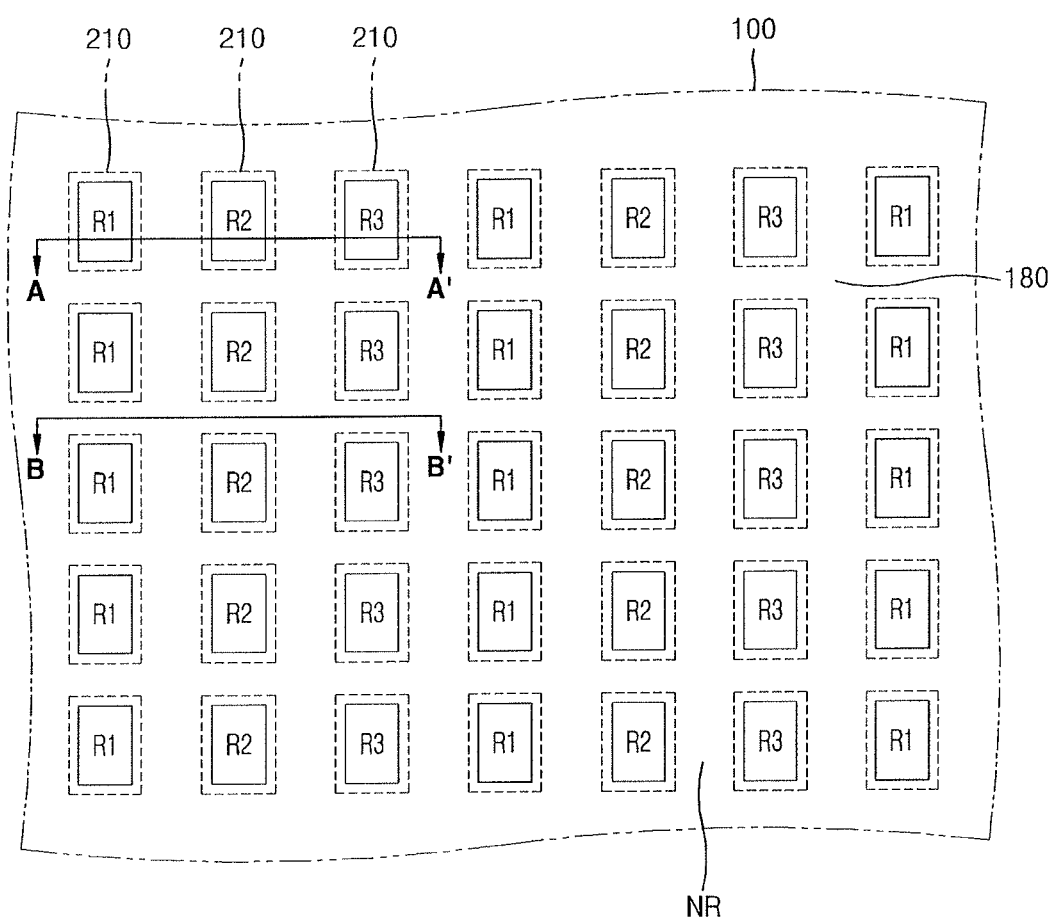
FIG. 6 illustrates a top view of FIG. 5.

FIG. 5 illustrates a schematic side view of the substrate 100 on which the plurality of emission portions, i.e., the first through third emission portions R1 through R3 are disposed, and FIG. 6 illustrates a top view of FIG. 5.

Referring to FIGS. 5 and 6, the pixel circuit PC may be formed on the substrate 100. The pixel circuit PC may include the TFT and the capacitor. Before forming the pixel circuit PC, the buffer layer may be formed on the substrate 100 to prevent impurities from penetrating into the substrate 100.

The pixel circuit PC may be formed according to the first through third emission portions R1 through R3 corresponding to a pixel, and covered by the insulating film 150 having an approximately flat top surface.

Then, a metal film may be formed on the insulating film 150 and then patterned to form the pixel electrode 210 according to the first through third emission portions R1 through R3. The pixel electrodes 210 may be patterned in island types to be separated from each other correspondingly to the first through third emission portions R1 through R3, and a material of the pixel electrode 210 has been described above with reference to FIGS. 1 through 3.

An organic insulating film may be formed on the substrate 100 on which the pixel electrode 210 is formed, and then patterned to form the pixel-defining film 180. The pixel-defining film 180 may have the opening OP exposing at least a portion of the top surface of the pixel electrode 210. The openings OP of the pixel-defining film 180 respectively may correspond to the first through third emission portions R1 through R3, and a region where the pixel-defining film 180 is disposed may correspond to the non-emission portion NR.

Figure 7:
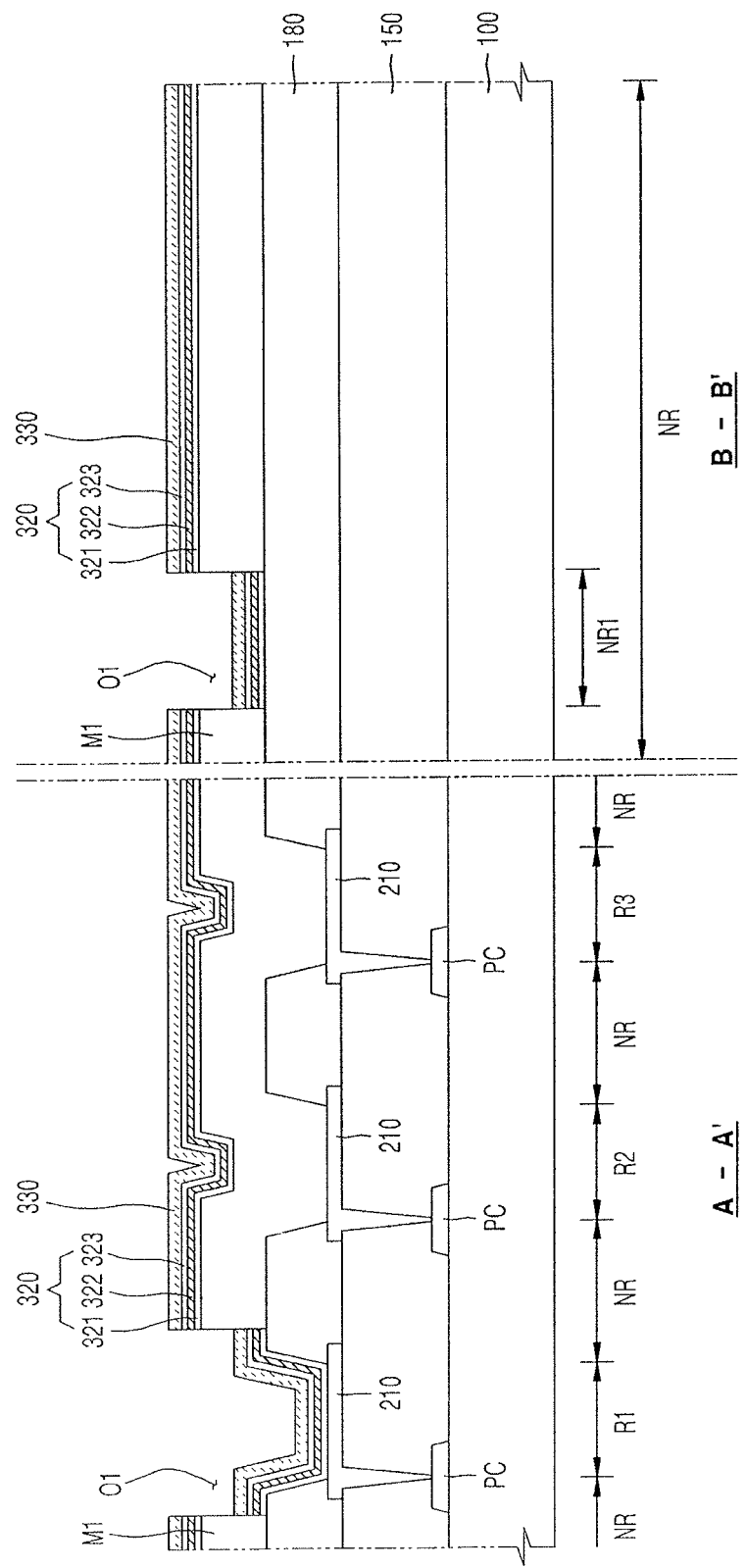
FIGS. 7 and 8 illustrate cross-sectional views for describing a process of forming a first stacked structure having a first pattern.
Figure 8:
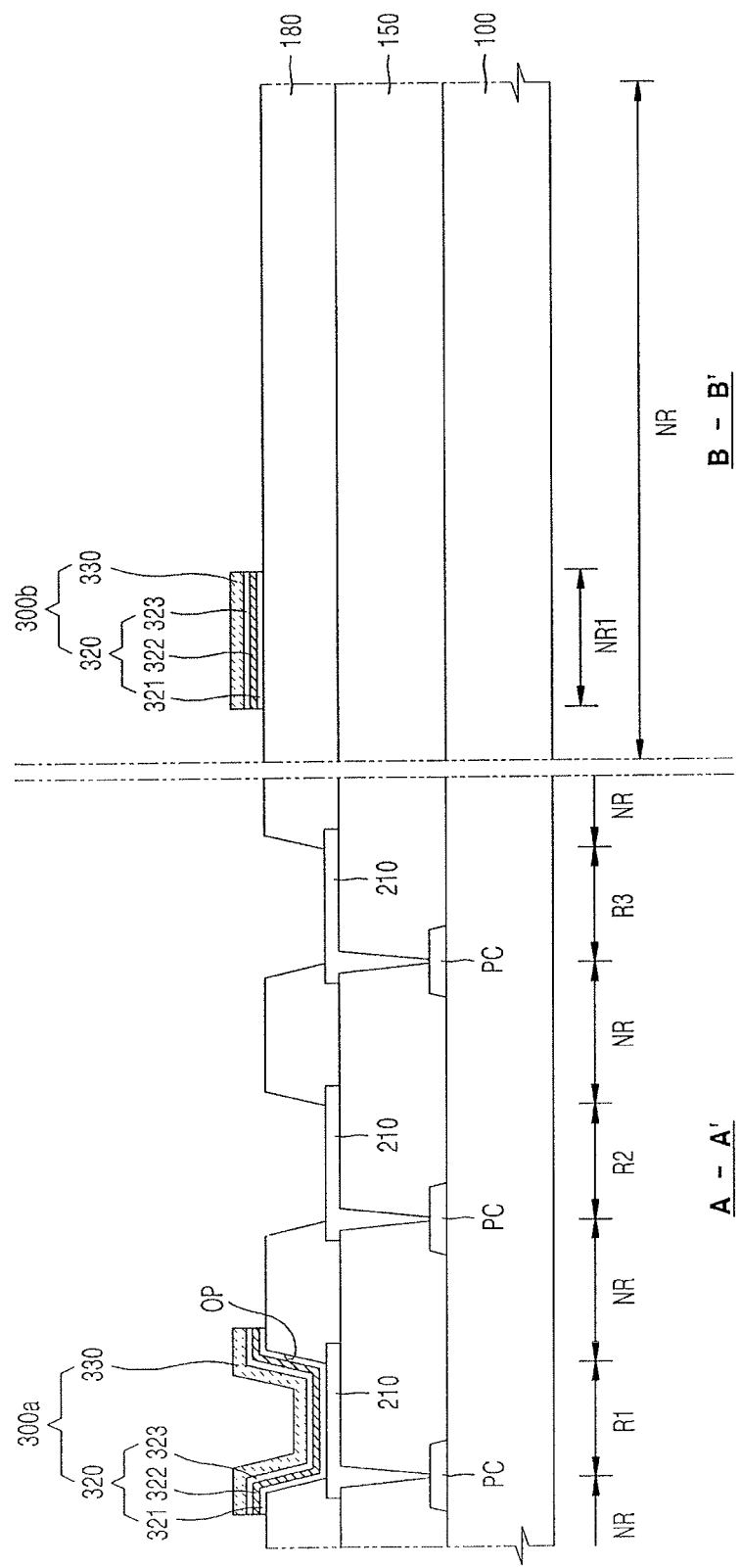
Figure 9:
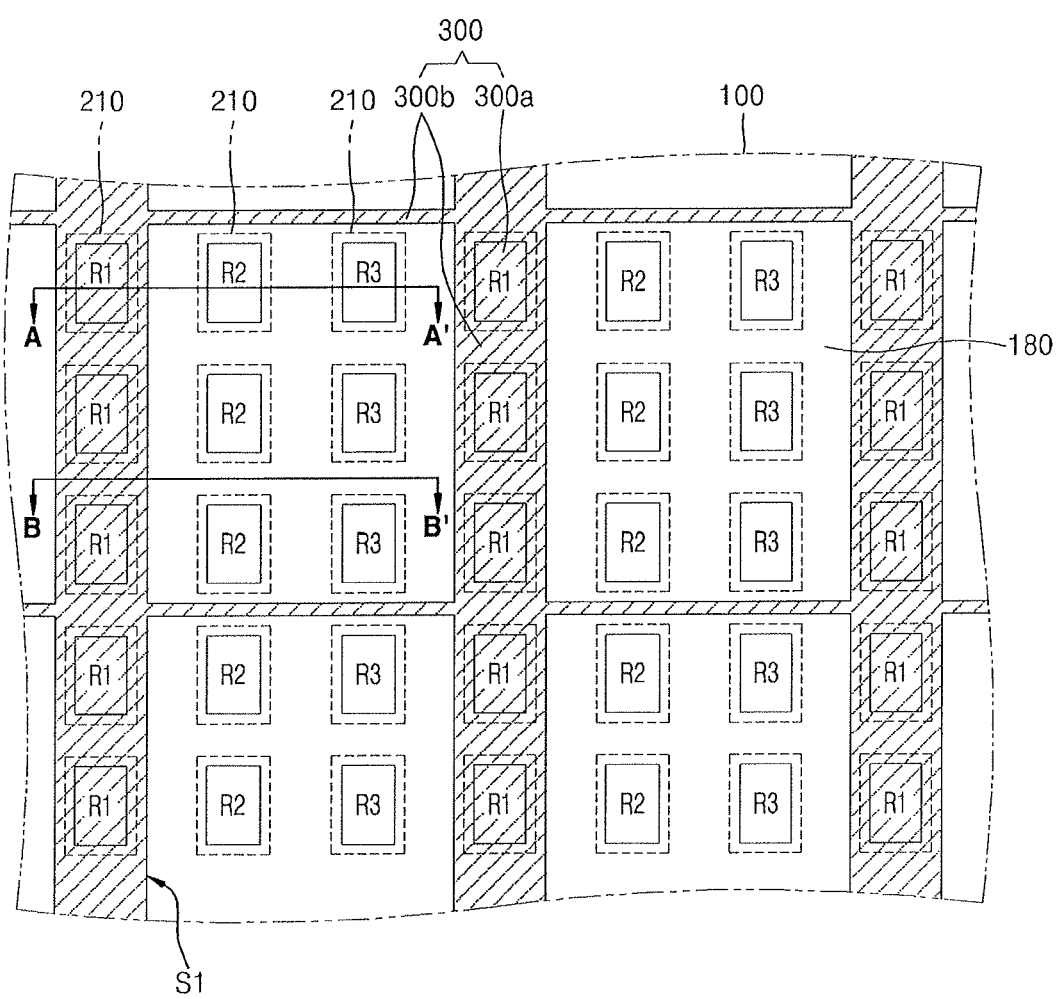
FIG. 9 illustrates a top view of FIG. 8.

FIGS. 7 and 8 illustrate cross-sectional views for describing a process of forming the first stacked structure R1 having the first pattern S1, and FIG. 9 illustrates a top view of FIG. 8.

Referring to FIG. 7, a first masking pattern M1 may be formed to cover an entire surface of the substrate 100 except the first emission portions R1 and a first region (hereinafter, referred to as a first non-emission portion) NR1 of the non-emission portion NR for connecting the first emission portions R1. A reference numeral O1 of FIG. 7 denotes an opening of the first masking pattern M1, which may expose the first emission portion R1 and the first non-emission portion NR1. The first non-emission portion NR1 may be a region corresponding to the first connection pattern portion 300b of the first stacked structure 300, which may be formed via a lift-off process described later.

The first masking pattern M1 may be formed of a polymer material. In an embodiment, the polymer material should satisfactorily dissolve in a solvent during the lift-off process and barely affect the intermediate layer 320.

Then, the intermediate layer 320 and the counter electrode 330 may be sequentially formed on the substrate 100 on which the first masking pattern M1 is formed. The intermediate layer 320 may include the first intermediate layer 321, the organic emission layer 322 realizing red, and the second intermediate layer 323. The first intermediate layer 321, the organic emission layer 322, the second intermediate layer 323, and the counter electrode 330 have been described above with reference to FIGS. 1 through 3.

According to an exemplary embodiment, a thickness of the first masking pattern M1 may be thicker than a sum of thicknesses of the intermediate layer 320 and the counter electrode 330. The intermediate layer 320 and the counter electrode 330, which may be formed on the first emission portions R1 and the first non-emission portion NR1 for connecting the first emission portions R1, may be discontinuous from the intermediate layer 320 and the counter electrode 330, which may be formed on the first masking pattern M1.

Referring to FIGS. 8 and 9, the first masking pattern M1 may be removed with the lift-off process. The first stacked structure 300 having the first pattern S1 may be formed on the substrate 100 when the first masking pattern M1 is removed.

As shown in FIGS. 8 and 9, the first stacked structure 300 may include the first emission pattern portions 300a respectively corresponding to the first emission portions R1, and the first connection pattern portions 300b connecting the first emission pattern portions 300a, wherein the first emission pattern portions 300a and the first connection pattern portions 300b form the first pattern S1. The first emission pattern portion 300a of the first stacked structure 300 may be disposed on the pixel electrode 210 that is exposed through the opening OP of the pixel-defining film 180, and the first connection pattern portion 300b of the first stacked structure 300 may be disposed on a portion of the top surface of the pixel-defining film 180.

Since the intermediate layer 320 of the first emission pattern portion 300a is disposed between the pixel electrode 210 and the counter electrode 330, when an electric signal is applied to each of the pixel electrode 210 and the counter electrode 330, excitons generated as holes and electrons discharged from the pixel electrode 210 and the counter electrode 330 that may combine at the organic emission layer 322 may change from an excited state to a ground state to generate a red light. Since the intermediate layer 320 of the first connection pattern portion 300b is disposed on the pixel-defining film 180 where the pixel electrode 210 is not disposed, light may not be emitted even when an electric signal is applied to the counter electrode 330 of the first stacked structure 300.

Figure 10:
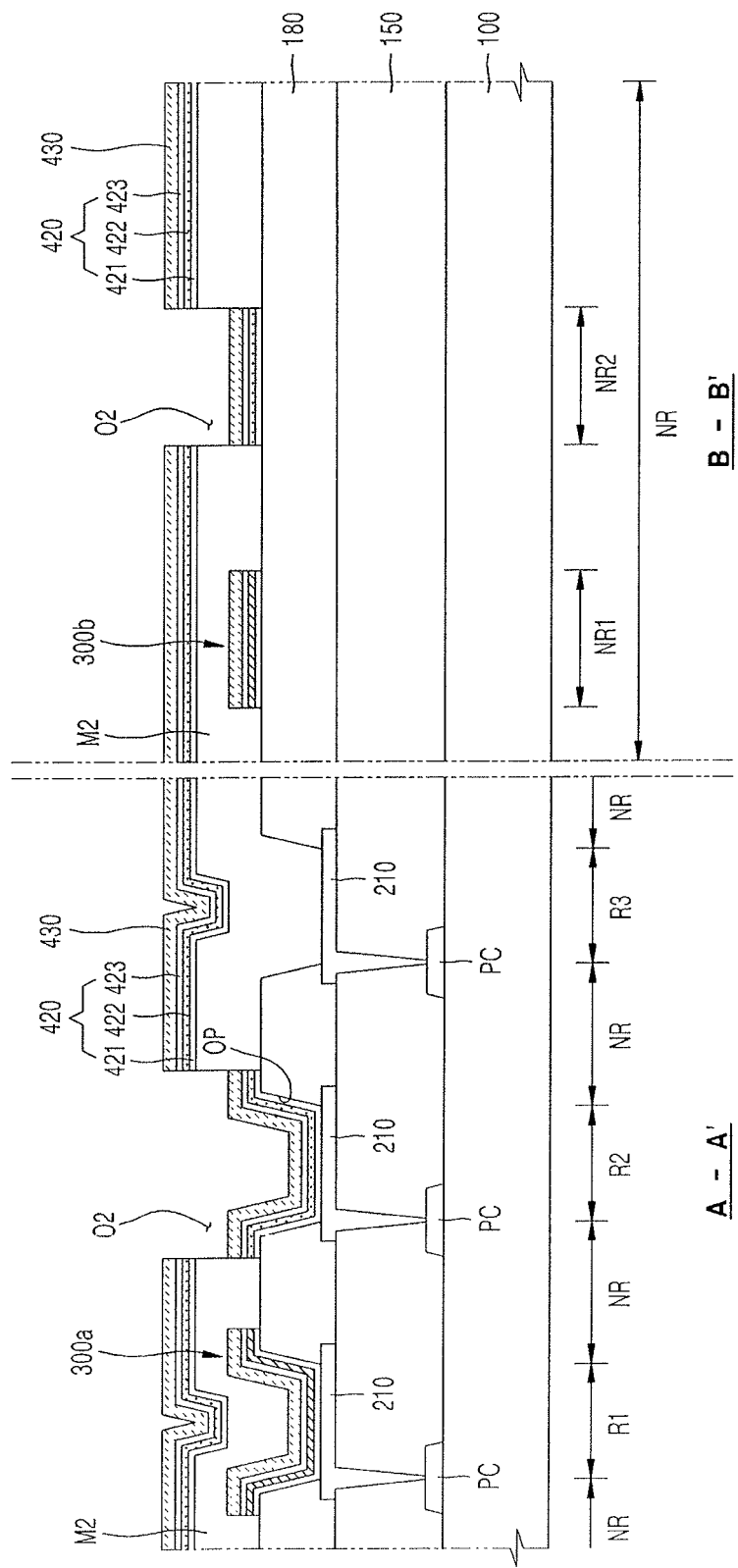
FIGS. 10 and 11 illustrate cross-sectional views for describing a process of forming a second stacked structure having a second pattern.
Figure 11:
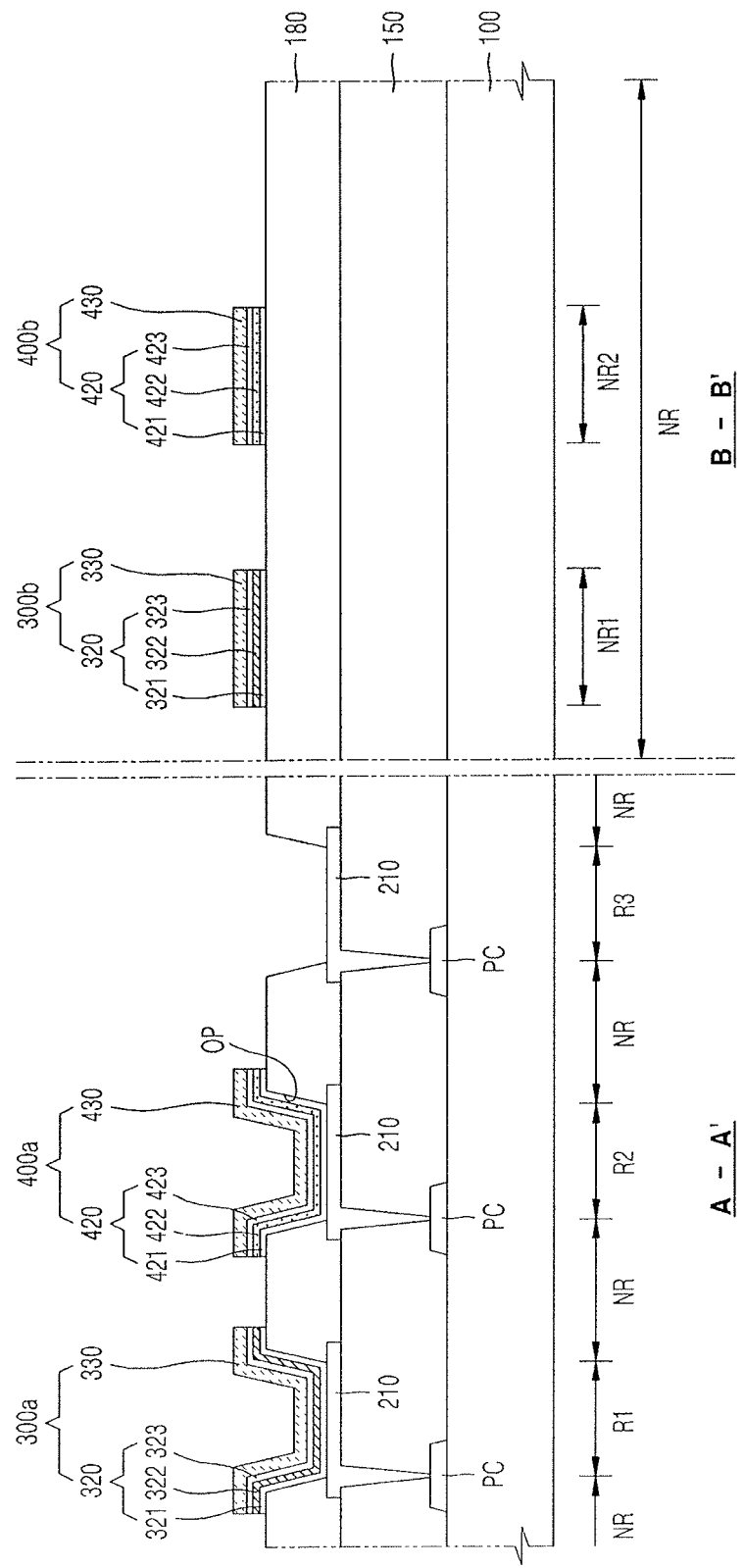
Figure 12:
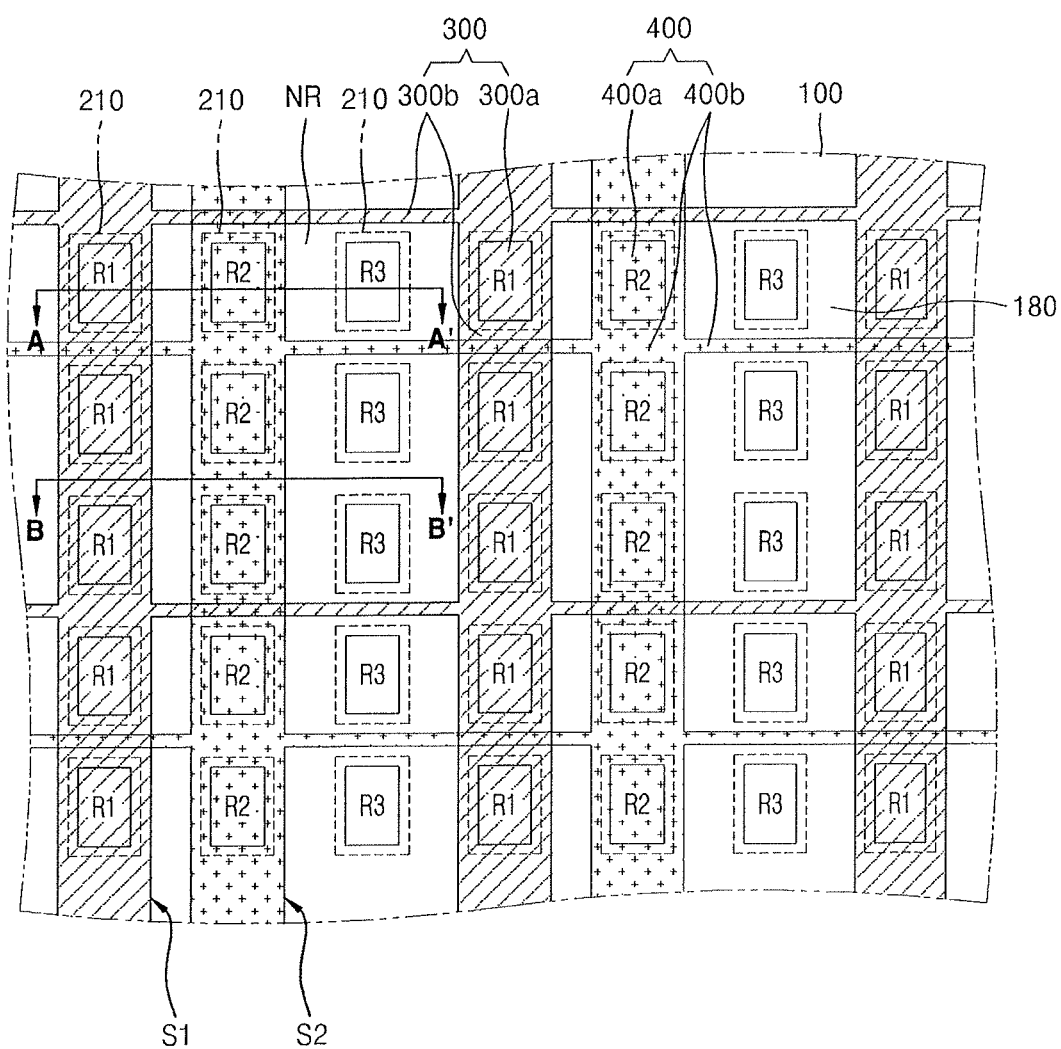
FIG. 12 illustrates a top view of FIG. 11.

FIGS. 10 and 11 illustrate cross-sectional views for describing a process of forming the second stacked structure 400 having the second pattern S2, and FIG. 12 illustrates a top view of FIG. 11.

Referring to FIG. 10, a second masking pattern M2 may be formed to cover an entire surface of the substrate 100 except the second emission portions R2 and a second region (hereinafter, referred to as a second non-emission portion) NR2 of the non-emission portion NR for connecting the second emission portions R2. A reference numeral O2 of FIG. 10 denotes an opening of the second masking pattern M2, which may expose the second emission portion R2 and the second non-emission portion NR2. The second non-emission portion NR2 may be a region corresponding to the second connection pattern portion 400*b* of the second stacked structure 400, which may be formed via a lift-off process described later.

The second masking pattern M2 may be formed of a polymer material. In an embodiment, the polymer material should satisfactorily dissolve in a solvent during the lift-off process and barely affect the intermediate layer 420.

Then, the intermediate layer 420 and the counter electrode 430 may be sequentially formed on the substrate 100 on which the second masking pattern M2 is formed. The intermediate layer 420 may include the first intermediate layer 421, the organic emission layer 422 realizing green, and the second intermediate layer 423. The first intermediate layer 421, the organic emission layer 422, the second intermediate layer 423, and the counter electrode 430 have been described above with reference to FIGS. 1 through 3.

According to an exemplary embodiment, a thickness of the second masking pattern M2 may be thicker than a sum of thicknesses of the intermediate layer 420 and the counter electrode 430. The intermediate layer 420 and the counter electrode 430, which may be formed on the second emission portions R2 and the second non-emission portion NR2 for connecting the second emission portions R2, may be discontinuous from the intermediate layer 420 and the counter electrode 430, which may be formed on the second masking pattern M2.

Referring to FIGS. 11 and 12, the second masking pattern M2 may be removed with the lift-off process. The second stacked structure 400 having the second pattern S2 may be formed on the substrate 100 when the second masking pattern M2 is removed.

As shown in FIGS. 11 and 12, the second stacked structure 400 may have the second pattern S2 including the second emission pattern portions 400*a* respectively corresponding to the second emission portions R2, and the second connection pattern portions 400*b* connecting the second emission pattern portions 400*a*. The second emission pattern portion 400*a* of the second stacked structure 400 may be disposed on the pixel electrode 210 that is exposed through the opening OP of the pixel-defining film 180, and the second connection pattern portion 400*b* of the second stacked structure 400 may be disposed on a portion of the top surface of the pixel-defining film 180.

Since the intermediate layer 420 of the second emission pattern portion 400*a* is disposed between the pixel electrode 210 and the counter electrode 430, when an electric signal is applied to each of the pixel electrode 210 and the counter electrode 430, excitons generated as holes and electrons discharged from the pixel electrode 210 and the counter electrode 430 that may combine at the organic emission layer 422 may change from an excited state to a ground state to generate a green light. Since the intermediate layer 420 of the second connection pattern portion 400*b* is disposed on the pixel-defining film 180 where the pixel electrode 210 is not disposed, light may not be emitted even when an electric signal is applied to the counter electrode 430 of the second stacked structure 400.

Figure 13:
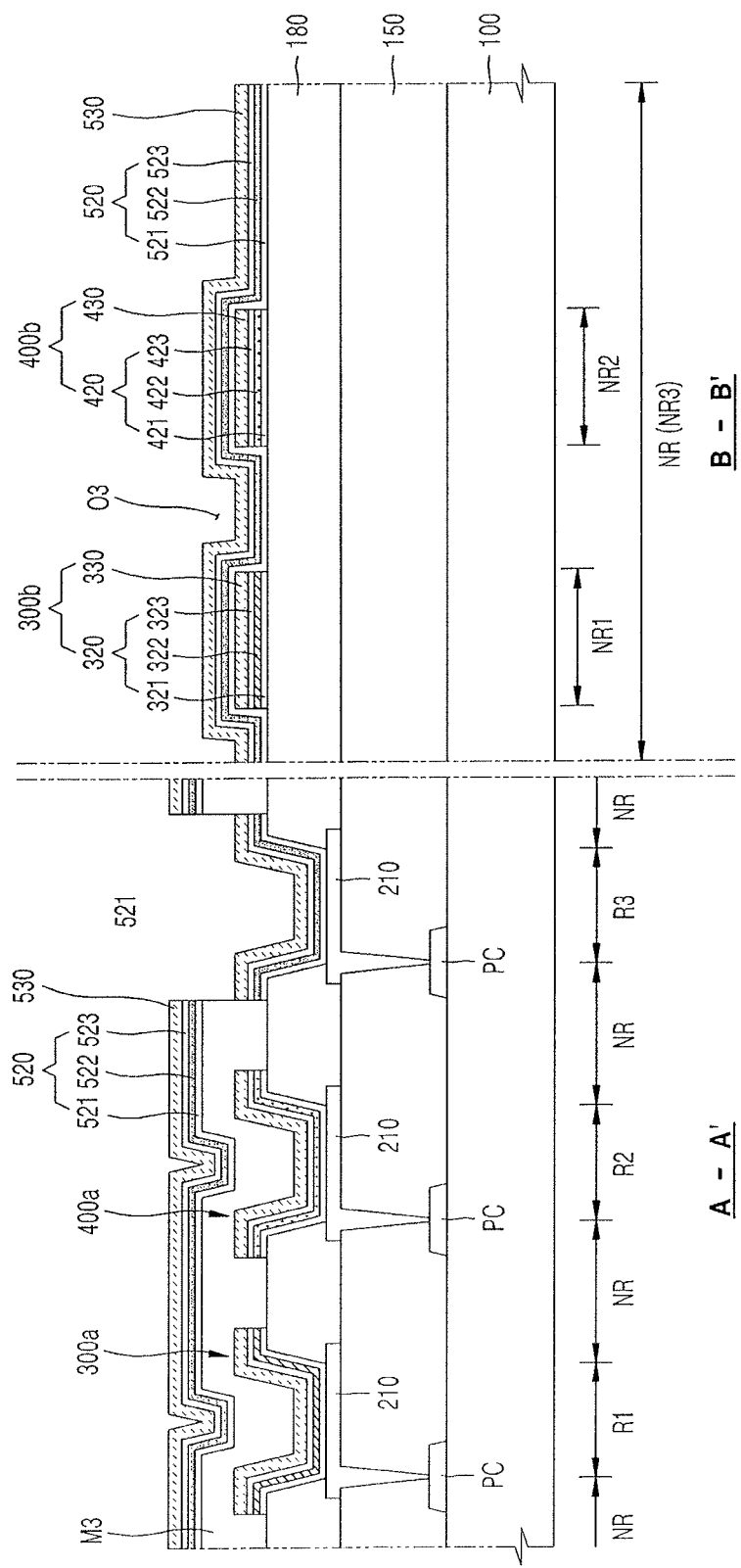
FIGS. 13 and 14 illustrate cross-sectional views for describing a process of forming a third stacked structure having a third pattern.
Figure 14:
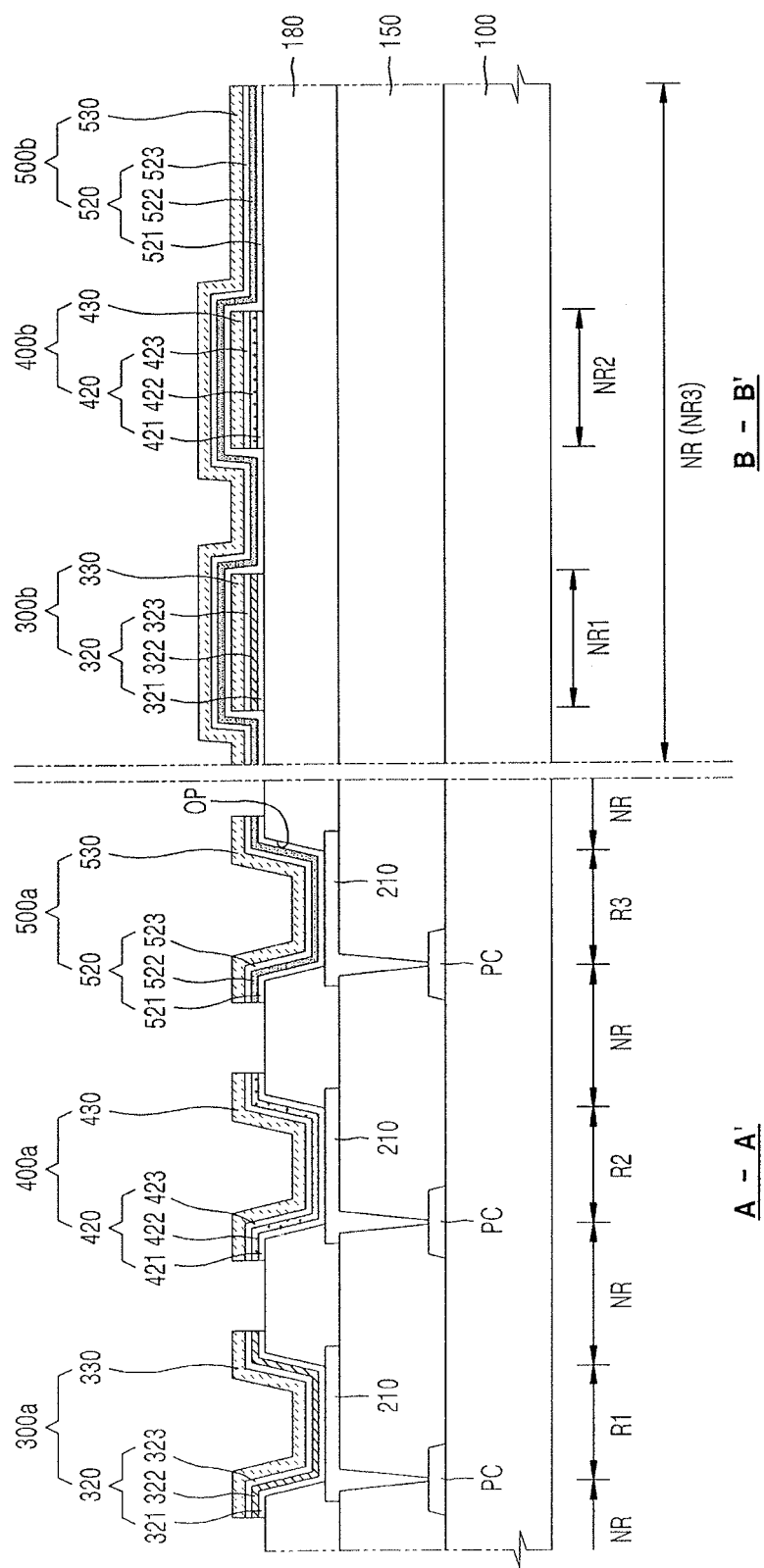
Figure 15:
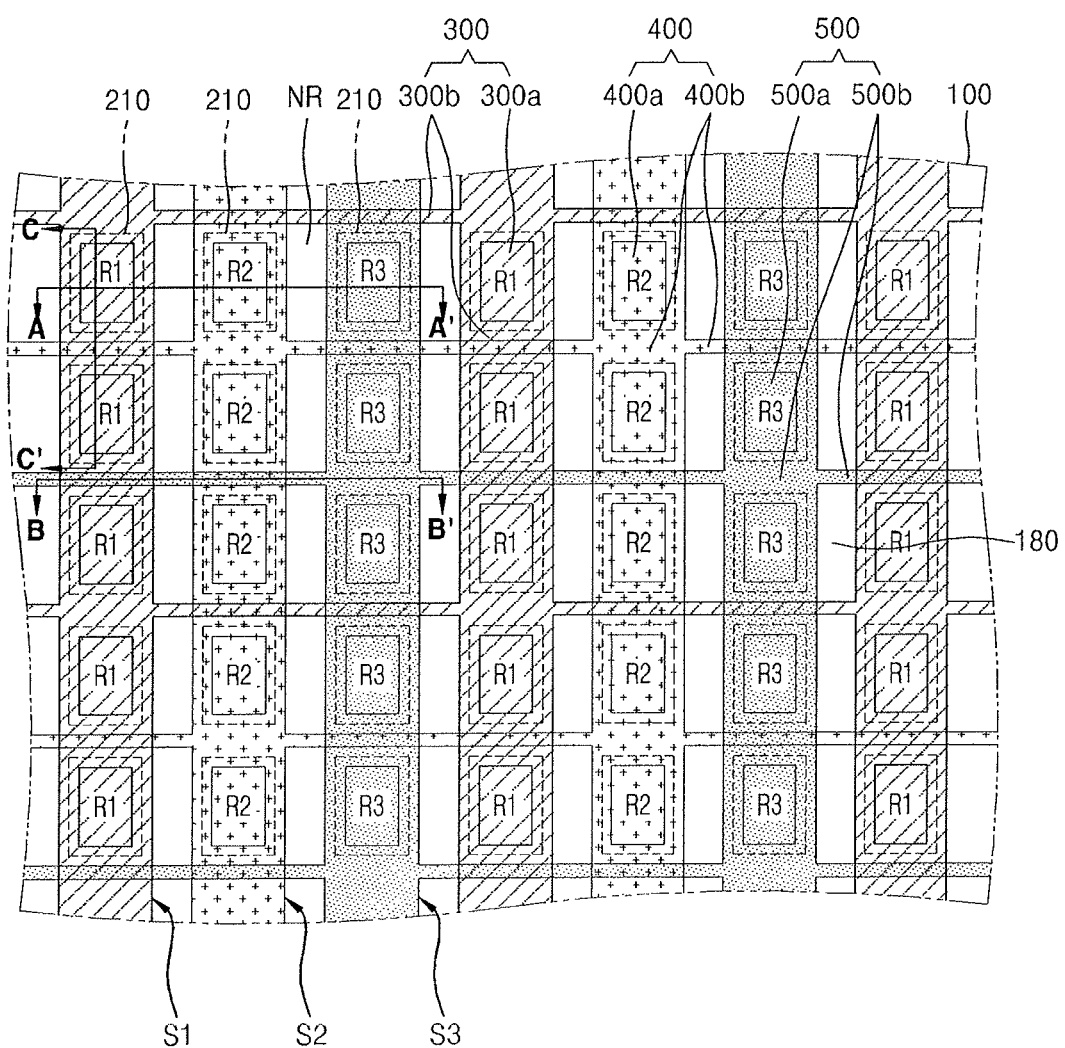
FIG. 15 illustrates a top view of FIG. 14.

FIGS. 13 and 14 illustrate cross-sectional views for describing a process of forming the third stacked structure 500 having the third pattern S3, and FIG. 15 illustrates a top view of FIG. 14.

Referring to FIG. 13, a third masking pattern M3 may be formed to cover an entire surface of the substrate 100 except the third emission portions R3 and a third region (hereinafter, referred to as a third non-emission portion) NR3 of the non-emission portion NR for connecting the third emission portions R3. A reference numeral O3 of FIG. 13 denotes an opening of the third masking pattern M3, which may expose the third emission portion R3 and the third non-emission portion NR3. The third non-emission portion NR3 may be a region corresponding to the third connection pattern portion 500*b* of the third stacked structure 500, which may be formed via a lift-off process described later.

The third masking pattern M3 may be formed of a polymer material. In an embodiment, the polymer material should satisfactorily dissolve in a solvent during the lift-off process and barely affect the intermediate layer 520.

Then, the intermediate layer 520 and the counter electrode 530 may be sequentially formed on the substrate 100 on which the third masking pattern M3 is formed. The intermediate layer 520 may include the first intermediate layer 521, the organic emission layer 522 realizing blue, and the second intermediate layer 523. The first intermediate layer 521, the organic emission layer 522, the second intermediate layer 523, and the counter electrode 530 have been described above with reference to FIGS. 1 through 3.

According to an exemplary embodiment, a thickness of the third masking pattern M3 may be thicker than a sum of thicknesses of the intermediate layer 520 and the counter electrode 530. The intermediate layer 520 and the counter electrode 530, which may be formed on the third emission portions R3 and the third non-emission portion NR3 for connecting the third emission portions R3, may be discontinuous from the intermediate layer 520 and the counter electrode 530, which may be formed on the third masking pattern M3.

Referring to FIGS. 14 and 15, the third masking pattern M3 may be removed with the lift-off process. The third stacked structure 500 having the third pattern S3 may be formed on the substrate 100 when the third masking pattern M3 is removed.

As shown in FIGS. 14 and 15, the third stacked structure 500 may include the third emission pattern portions 500*a* respectively corresponding to the third emission portions R3, and the third connection pattern portions 500*b* connecting the third emission pattern portions 500*a*, wherein the third emission pattern portions 500*a* and the third connection pattern portions 500*b* form the third pattern S3. The third emission pattern portion 500*a* of the third stacked structure 500 may be disposed on the pixel electrode 210 that is exposed through the opening OP of the pixel-defining film 180, and the third connection pattern portion 500*b* of the third stacked structure 500 may be disposed on a portion of the top surface of the pixel-defining film 180.

Since the intermediate layer 520 of the third emission pattern portion 500*a* is disposed between the pixel electrode 210 and the counter electrode 530, when an electric signal is applied to each of the pixel electrode 210 and the counter electrode 530, excitons generated as holes and electrons discharged from the pixel electrode 210 and the counter electrode 530 that may combine at the organic emission layer 522 may change from an excited state to a ground state to generate a blue light. Since the intermediate layer 520 of the third connection pattern portion 500*b* is disposed on the pixel-defining film 180 where the pixel electrode 210 is not disposed, light may not be emitted even when an electric signal is applied to the counter electrode 530 of the third stacked structure 500.

In an embodiment, the first through third stacked structures 300 through 500 may be sequentially formed in FIGS. 5 through 15. Since the first through third stacked structures 300 through 500 may be independently, for example, individually, patterned, a patterning order may be changed.

According to one or more exemplary embodiments, the intermediate layers 320 through 520 and the counter electrodes 330 through 530 of the first through third stacked structures 300 through 500 may be patterned together, and separate processes for patterning the counter electrodes 330 through 530 may not be required. Since top surfaces of the intermediate layers 320 through 520 may be patterned while being covered by the counter electrodes 330 through 530, the top surfaces of the intermediate layers 320 through 520 may be protected by the counter electrodes 330 through 530, and a possibility of impurities being disposed between the intermediate layers 320 through 520 and the counter electrodes 330 through 530 may be reduced.

Figure 16:
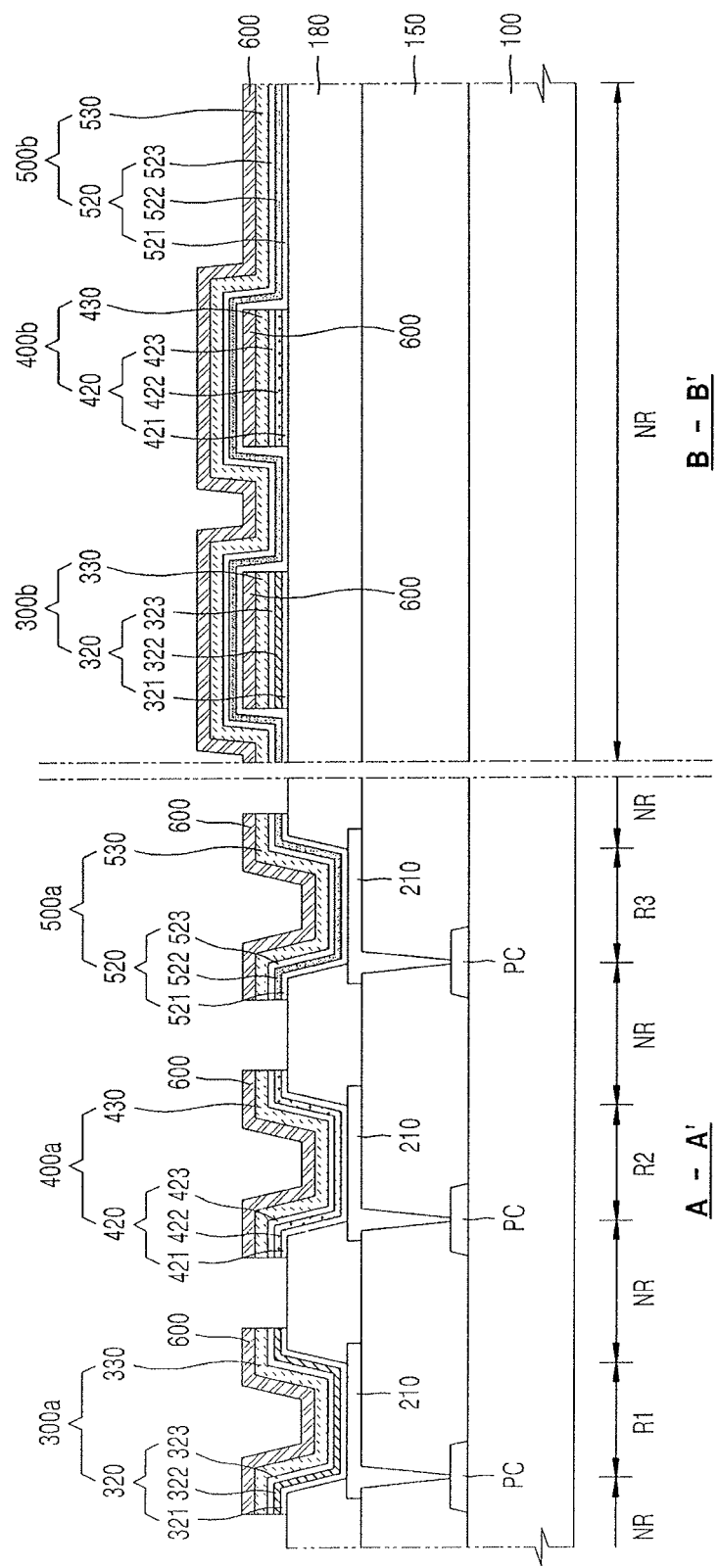
FIG. 16 illustrates a schematic cross-sectional view of an organic light-emitting display device according to an exemplary embodiment.

FIG. 16 illustrates a schematic cross-sectional view of an organic light-emitting display device according to an exemplary embodiment.

Referring to FIG. 16, a protection film 600 may be disposed on at least one of the counter electrodes 330 through 530 of the first through third stacked structures 300 through 500. According to some exemplary embodiments, when the counter electrodes 330 through 530 are a (semi-)transparent electrode including a metal, such as an Ag—Mg alloy, transmissivity may be decreased as the counter electrodes 330 through 530 are exposed to oxygen and oxidized, but when the protection film 600 is disposed on the counter electrodes 330 through 530, oxidization of the counter electrodes 330 through 530 may be prevented.

The protection film 600 may include a conductive material or a nonconductive (insulating) material. According to an exemplary embodiment, when the organic light-emitting display device is a top-emission type, the protection film 600 may include an organic material and/or an inorganic material having transparency. According to an exemplary embodiment, when the organic light-emitting display device is a bottom-emission type, the protection film 600 may include an opaque material.

While manufacturing the first through third stacked structures 300 through 500, the protection film 600 may be patterned together with the intermediate layers 320 through 520 and the counter electrodes 330 through 530. The protection film 600 may have substantially the same pattern as the intermediate layers 320 through 520 and the counter electrodes 330 through 530.

Figure 17:
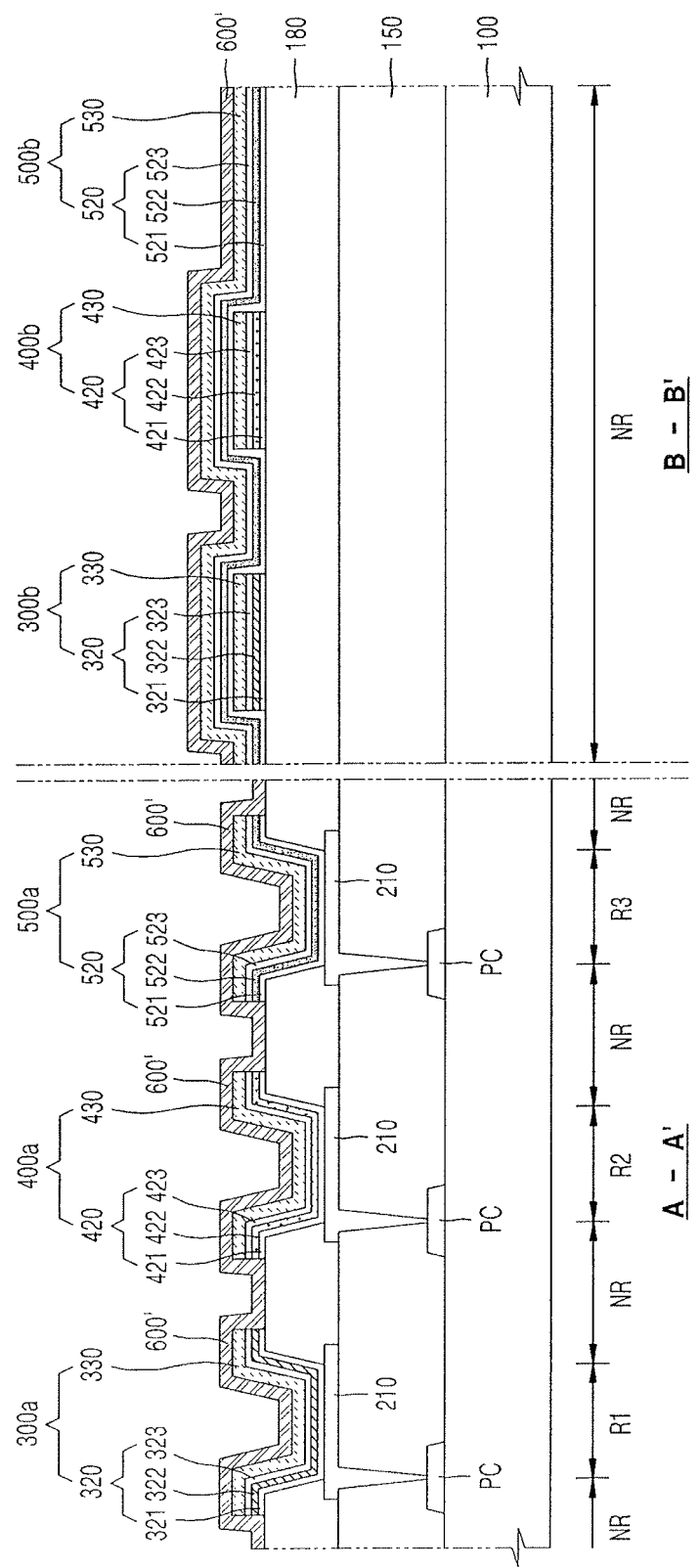
FIG. 17 illustrates a schematic cross-sectional view of an organic light-emitting display device according to an exemplary embodiment.

FIG. 17 illustrates a schematic cross-sectional view of an organic light-emitting display device according to an exemplary embodiment.

Referring to FIG. 17, a protection film 600' may be disposed on the substrate 100 to cover the first through third stacked structures 300 through 500. For example, the protection film 600' may be formed on the substrate 100 to integrally cover all of the first through third stacked structures 300 through 500.

The protection film 600' may include a conductive material or a nonconductive (insulating) material. According to an exemplary embodiment, when the organic light-emitting display device is a top-emission type, the protection film 600' may include an organic material and/or an inorganic material having transparency. According to an exemplary embodiment, when the organic light-emitting display device is a bottom-emission type, the protection film 600' may include an opaque material.

The protection film 600' may be formed via a process separate from the first through third stacked structures 300 through 500. For example, the protection film 600' may be formed to cover the entire surface of the substrate 100 after the first through third stacked structures 300 through 500 are formed.

As described above, according to one or more exemplary embodiments, an organic light-emitting display device in which occurrence of luminance deviation is suppressed by reducing an IR drop may be provided.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display device, comprising:
a substrate;
a plurality of pixel electrodes over the substrate, the plurality of pixel electrodes are separated from each other;
a pixel-defining layer having a plurality of openings respectively corresponding to the plurality of pixel electrodes;
a first intermediate layer over a first pixel electrode of the plurality of pixel electrodes, the first intermediate layer including a first light-emitting layer;
a second intermediate layer over a second pixel electrode of the plurality of pixel electrodes, the second intermediate layer including a second light-emitting layer;
a first counter electrode over the first intermediate layer, and
a second counter electrode over the second intermediate layer,
wherein a portion of the first intermediate layer and a portion of the second intermediate layer overlap each other over an upper surface of the pixel-defining layer, wherein:
the first intermediate layer includes a first sub-intermediate layer between the first pixel electrode and the first light-emitting layer, and
the second intermediate layer includes a second sub-intermediate layer between the second pixel electrode and the second light-emitting layer, and
wherein portions of the first sub-intermediate layer and the second sub-intermediate layer overlap each other in a region between neighboring pixel electrodes.

2. The organic light-emitting display device as claimed in claim 1, further comprising an insulating layer between the substrate and the pixel-defining layer, wherein a portion of the pixel-defining layer directly contacts an upper surface of the insulating layer.

3. The organic light-emitting display device as claimed in claim 2, wherein an overlapping region between the portions of the first and second intermediate layers corresponds to a contact region between the portion of the pixel-defining layer and the upper surface of the insulating layer.

4. The organic light-emitting display device as claimed in claim 3, wherein each of the first and second intermediate layers further includes at least one of a hole transport layer, a hole injection layer, an electron transport layer, or an electron injection layer.

5. The organic light-emitting display device as claimed in claim 1, wherein:

the first intermediate layer includes a third sub-intermediate layer between the first light-emitting layer and the first counter electrode, and the second intermediate layer includes a fourth sub-intermediate layer between the second light-emitting layer and the second counter electrode, and wherein portions of the third sub-intermediate layer and the fourth sub-intermediate layer overlap each other in a region between neighboring pixel electrodes.

6. The organic light-emitting display device as claimed in claim 1, further comprising a protection film over the first and second counter electrodes.

7. The organic light-emitting display device as claimed in claim 6, wherein the protection film includes a transparent material.

8. The organic light-emitting display device as claimed in claim 6, wherein the protection film includes a conductive material.

9. An organic light-emitting display device, comprising:
a substrate; and
a plurality of organic light-emitting diodes (OLEDs) over the substrate, the plurality of OLEDs including a first OLED emitting light of a first color and a second OLED emitting light of a second color,
wherein a plurality of pixel electrodes of the plurality of OLEDs are separated each other on the substrate, edges of the plurality of pixel electrodes are covered by a pixel-defining layer, and the pixel-defining layer has a plurality of openings respectively corresponding to the plurality of pixel electrodes,
wherein a first intermediate layer of the first OLED includes a first portion overlapping a first pixel electrode of the plurality of pixel electrodes and a second portion extending from the first portion,
wherein a second intermediate layer of the first OLED includes a third portion overlapping a second pixel electrode of the plurality of pixel electrodes and a fourth portion extending from the third portion,
wherein the second portion and the fourth portion overlap each other over an upper surface of the pixel-defining layer,
wherein each of the first and second intermediate layers includes a sub-intermediate layer, the sub-intermediate layer includes at least one of a hole transport layer, a hole injection layer, an electron transport layer, or an electron injection layer, and
wherein the sub-intermediate layer of the first intermediate layer overlaps the sub-intermediate layer of the second intermediate layer in a region over the upper surface of the pixel-defining layer.

10. The organic light-emitting display device as claimed in claim 9, wherein an overlapping region between the second portion and the fourth portion corresponds to a region between neighboring pixel electrodes.

11. The organic light-emitting display device as claimed in claim 10, further comprising an insulating layer between the substrate and the pixel-defining layer, wherein the pixel-defining layer contacts an upper surface of the insulating layer in the overlapping region.

12. The organic light-emitting display device as claimed in claim 9, wherein:
the first and second OLEDs respectively includes a first and second light-emitting layers, and
in the region, at least one of the first and second light-emitting layers is between the sub-intermediate layer of the first intermediate layer overlaps the sub-intermediate layer.

13. An organic light-emitting display device, comprising:
a substrate;
a plurality of pixel electrodes over the substrate, the plurality of pixel electrodes are separated from each other;
a pixel-defining layer having a plurality of openings respectively corresponding to the plurality of pixel electrodes;
a first intermediate stack over a first pixel electrode of the plurality of pixel electrodes, the first intermediate stack including a first light-emitting layer; and
a second intermediate stack over a second pixel electrode of the plurality of pixel electrodes, the second intermediate stack including a second light-emitting layer;
wherein the first light-emitting layer and the second light-emitting layer partially overlap each other in a region between neighboring pixel electrodes.

14. The organic light-emitting display device as claimed in claim 13, wherein an overlapping region between the first intermediate stack and the second intermediate stack does not overlap the pixel electrodes.

15. The organic light-emitting display device as claimed in claim 13, wherein an overlapping region between the first intermediate stack and the second intermediate stack is located over an upper surface of the pixel-defining layer.

16. The organic light-emitting display device as claimed in claim 13, further comprises a first counter electrode over the first intermediate stack, and a second counter electrode over the second intermediate stack.

17. The organic light-emitting display device as claimed in claim 13, wherein the first intermediate stack further comprises a first sub-intermediate layer, and the second intermediate stack further comprises a second sub-intermediate layer.

18. The organic light-emitting display device as claimed in claim 17, wherein each of the first sub-intermediate layer and the second sub-intermediate layer comprises at least one of a hole transport layer, a hole injection layer, an electron transport layer, or an electron injection layer.

* * * * *